(12) United States Patent
Ernst et al.

(10) Patent No.: US 8,847,395 B2
(45) Date of Patent: Sep. 30, 2014

(54) MICROELECTRONIC DEVICE HAVING METAL INTERCONNECTION LEVELS CONNECTED BY PROGRAMMABLE VIAS

(75) Inventors: Thomas Ernst, Morette (FR); Paul-Henry Morel, Corenc (FR); Sylvain Maitrejean, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/808,043

(22) PCT Filed: Jul. 5, 2011

(86) PCT No.: PCT/EP2011/061332
§ 371 (c)(1),
(2), (4) Date: Mar. 15, 2013

(87) PCT Pub. No.: WO2012/004267
PCT Pub. Date: Jan. 12, 2012

(65) Prior Publication Data
US 2013/0187276 A1    Jul. 25, 2013

(30) Foreign Application Priority Data

Jul. 6, 2010 (FR) .................................. 10 55467

(51) Int. Cl.
| | | |
|---|---|---|
| H01L 23/48 | (2006.01) | |
| H01L 23/52 | (2006.01) | |
| H01L 29/40 | (2006.01) | |
| H01L 21/768 | (2006.01) | |
| H01L 21/822 | (2006.01) | |
| H01L 29/423 | (2006.01) | |
| H01L 21/02 | (2006.01) | |
| H01L 21/8234 | (2006.01) | |
| H01L 29/786 | (2006.01) | |
| H01L 29/66 | (2006.01) | |
| H01L 23/522 | (2006.01) | |
| H01L 29/06 | (2006.01) | |
| H01L 29/775 | (2006.01) | |
| H01L 23/525 | (2006.01) | |
| H01L 27/105 | (2006.01) | |

(52) U.S. Cl.
CPC ...... *H01L 21/76879* (2013.01); *H01L 21/8221* (2013.01); *H01L 29/42392* (2013.01); *H01L 21/02532* (2013.01); *H01L 21/823487* (2013.01); *H01L 2221/1094* (2013.01); *H01L 21/02653* (2013.01); *H01L 21/02603* (2013.01); *H01L 29/78642* (2013.01); *H01L 21/02425* (2013.01); *H01L 29/66439* (2013.01); *H01L 21/02639* (2013.01); *H01L 23/5226* (2013.01); *H01L 29/66666* (2013.01); *H01L 29/0676* (2013.01); *H01L 29/775* (2013.01); *H01L 27/105* (2013.01); *H01L 21/76802* (2013.01); *H01L 29/0665* (2013.01); *H01L 40/00* (2013.01); *H01L 10/00* (2013.01); *H01L 21/0262* (2013.01); *H01L 23/525* (2013.01)
USPC .............. 257/758; 257/E51.04; 257/E51.023; 257/10; 257/471; 257/54; 438/573; 438/578

(58) Field of Classification Search
CPC ................................ H01L 29/00; H01L 51/00
USPC .......... 257/10, 471, 54, E51.04, 33; 438/573, 438/578
See application file for complete search history.

(56) References Cited

U.S. PATENT DOCUMENTS

| | | | |
|---|---|---|---|
| 5,627,395 A | | 5/1997 | Witek et al. |
| 5,943,574 A | | 8/1999 | Tehrani et al. |
| 6,284,562 B1 | * | 9/2001 | Batlogg et al. .................. 438/99 |
| 7,161,215 B2 | * | 1/2007 | Chakihara et al. ............. 257/365 |
| 7,190,031 B2 | * | 3/2007 | Chakihara et al. ............. 257/365 |
| 7,495,289 B2 | * | 2/2009 | Chakihara et al. ............. 257/365 |
| 7,687,876 B2 | * | 3/2010 | Kabir .............................. 257/471 |
| 7,701,020 B2 | * | 4/2010 | Chakihara et al. ............. 257/401 |
| 7,777,291 B2 | * | 8/2010 | Kabir .............................. 257/471 |
| 7,972,920 B2 | * | 7/2011 | Chakihara et al. ............. 438/212 |
| 7,977,761 B2 | * | 7/2011 | Kabir .............................. 257/471 |
| 8,476,138 B2 | * | 7/2013 | Chakihara et al. ............. 438/279 |
| 2002/0001905 A1 | | 1/2002 | Choi et al. |

| | | | |
|---|---|---|---|
| 2004/0043550 A1* | 3/2004 | Chakihara et al. ............ 438/199 |
| 2006/0118975 A1 | 6/2006 | Koenenkamp |
| 2006/0125025 A1 | 6/2006 | Kawashima et al. |
| 2006/0192231 A1 | 8/2006 | Nihei |
| 2006/0202286 A1* | 9/2006 | Chakihara et al. ............ 257/393 |
| 2006/0208319 A1* | 9/2006 | Chakihara et al. ............ 257/369 |
| 2008/0119016 A1 | 5/2008 | Dubin et al. |
| 2009/0033360 A1 | 2/2009 | Chen et al. |
| 2009/0108251 A1* | 4/2009 | Kabir ............................ 257/14 |
| 2009/0140342 A1* | 6/2009 | Chakihara et al. ............ 257/365 |
| 2010/0078681 A1 | 4/2010 | Riechert et al. |
| 2010/0136778 A1* | 6/2010 | Chakihara et al. ............ 438/587 |
| 2010/0151662 A1 | 6/2010 | Nihei |
| 2010/0171093 A1* | 7/2010 | Kabir ............................ 257/10 |
| 2011/0230041 A1* | 9/2011 | Chakihara et al. ............ 438/587 |

FOREIGN PATENT DOCUMENTS

DE    102 50 984 A1    5/2004

OTHER PUBLICATIONS

International Search Report issued Aug. 29, 2011 in PCT/EP2011/061332 submitting English translation only.
Search Report issued Apr. 20, 2011 in French Patent Application No. 1055467 with English translation of categories of cited documents.
K. N. Chen, et al., "Programmable via Using Indirectly Heated Phase-Change Switch for Reconfigurable Logic Applications", Electron Device Letters, vol. 29, No. 1, 2008, pp. 131-133.
Cheol-Joo Kim, et al., "Vertically aligned Si intrananowire p-n diodes by large-area epitaxial growth", Applied Physics Letters, 94, 2009, pp. 173105-1-173105-3.
Volker Schmidt, et al., "Realization of a Silicon Nanowire Vertical Surround-Gate Field-Effect Transistor", Small, vol. 2, No. 1, 2006, pp. 85-88.

* cited by examiner

*Primary Examiner* — Telly Green
(74) *Attorney, Agent, or Firm* — Oblon, Spivak, McClelland, Maier & Neustadt, L.L.P.

(57)    ABSTRACT

A microelectronic device, including: a substrate and a plurality of metal interconnection levels stacked on the substrate; a first metal line of a given metal interconnection level; a second metal line of another metal interconnection level located above the given metal interconnection level, the first and second lines are interconnected via at least one semiconductor connection element extending in a direction forming a nonzero angle with the first metal lines and the second metal line; and a gate electrode capable of controlling conduction of the semiconductor connection element.

12 Claims, 20 Drawing Sheets

MICROELECTRONIC DEVICE HAVING METAL INTERCONNECTION LEVELS CONNECTED BY PROGRAMMABLE VIAS

TECHNICAL FIELD

The present invention relates to the field of microelectronic devices and integrated circuits, and more particularly to that of stacked interconnection metal levels in said circuits or devices.

The invention relates to the implementation of a structure comprising a gate electrode having an improved arrangement and provided to control the conduction of vertical interconnection elements, commonly known as "vias", in order to form programmable vias electrically connecting different metal interconnection levels.

PRIOR ART

To control the flow of current between two logic blocks or circuits, fusible interconnection elements exist, for example of the type known as "laser" or "electro-migration".

Said interconnection elements generally have the drawbacks of being bulky, of operating for important current ranges and not being reusable.

In the case of over-currents, such elements no longer ensure interconnections between the circuits.

Furthermore, for electro-migration fusible interconnection elements, an additional error detection circuit may be made necessary.

In another field, that of programmable logic arrays and in particular FPGA (Field Programmable Gate Array), elementary logic cells may be interconnected in a reversible manner by programming.

To this end, reprogrammable connections are made by means of a flash memory, connected to a transistor that controls the flow of current between two blocks.

This type of reprogrammable interconnection may be reused a limited number of times, for example of the order of 20000 times, is bulky, and generally operates for important voltage ranges incompatible with the voltages used for CMOS logic.

The document of K. N. Chen, "Programmable via Using Indirectly Heated Phase-Change Switch for Reconfigurable Logic Applications", Electron Device Letters, Vol. 29, No 1, 2008, discloses a microelectronic device provided with stacked metal interconnection levels and interconnected by vias known as "programmable" formed of a phase change material, the resistance of which is made to vary by varying the heat applied to said material by means of a heating conducting line.

Such a device poses problems in terms in particular of rapidity of operation in dynamic mode, of variability over time of the resistance of the vias, and consumption.

The documents U.S. Pat. No. 5,627,395, US 2008 0119016 A1 disclose an interconnection structure making it possible to interconnect metal lines in the form of a transistor with vertical semiconductor channel, the conduction of which is modulated by means of a gate electrode formed around the channel.

The production of such a gate electrode is complex in so far as it requires a precise positioning and dimensioning.

The problem is posed of producing a novel interconnection structure with vertical semiconductor channel wherein the implementation of the gate does not have the aforementioned drawbacks.

DESCRIPTION OF THE INVENTION

The invention relates to a method for producing a microelectronic device comprising the steps of:
  forming, on a first metal line of a given metal interconnection level and in a cavity formed through a dielectric layer resting on the first metal line, at least one semiconductor connection element intended to connect the first metal line to a second metal line of another metal interconnection line located above said given metal interconnection line and such that the semiconductor connection element extends in a direction forming a nonzero angle with said first metal line and second metal line,
  formation in said cavity of a gate electrode to control the conduction of said semiconductor connection element.

In forming the gate electrode, particularly by deposition of gate dielectric and gate material in a cavity in which the semiconductor element is already arranged, a gate electrode is formed, without having to dimension said gate electrode by means of one or more etching steps.

According to a first implementation possibility of the method, the formation of the semiconductor element may be obtained by growth directly on the first metal line, such that the semiconductor element produced is formed in contact with said line.

In this case, the growth of the semiconductor element may be, according to a first possibility, carried out by means of a catalyst deposited on the first metal line.

The growth may be carried out in a cavity comprising lateral sides and a bottom, the bottom exposing the first metal line, the growth of the semiconductor element being able to be carried out by means of a block of catalyst formed by selective deposition, without covering the sides of the cavity.

According to a second possibility, the growth of the semiconductor element may be carried out by making use of the metal material of the first metal line as catalyst.

The formation of the semiconductor element may be implemented in a cavity formed through a dielectric layer and exposing the first metal line.

The method may further comprise the formation of the second metal line on the semiconductor element, after having formed the gate.

According to a possibility, the formation of the semiconductor element may be implemented from a first semiconductor or metal zone in contact with the first metal line.

In this case, said cavity exposes said semiconductor zone.

Said cavity may also comprise lateral sides exposing regions of a second zone, semiconductor or metal, in contact with the second metal line.

The method may further comprise, after having formed the cavity and prior to the formation of the semiconductor element, an etching of said dielectric layer so as to widen a part of said cavity and expose a lower face of said second zone in contact with the second metal line, the semiconductor element which is able to be formed from the first zone in contact with the first metal line and so as to reach said second zone in contact with the second metal line.

According to one or the other of the variants described previously, the semiconductor element may be formed of a plurality of nano-wires. According to an implementation possibility of said embodiment variant, the method may comprise the steps consisting in:
  growing the semiconductor element in the form of several nano-wires on the semiconductor zone,
  forming the dielectric layer, so as to surround the nano-wires, exposing at least one end of each semiconductor nano-wire, the method being able to further comprise the formation of another semiconductor zone in contact with the nanowires and the second metal line on said other semiconductor zone.

The step consisting in exposing at least one end of each semiconductor nano-wire may be carried out by polishing.

The method may then further comprise:
the formation of the cavity around nano-wires and exposing the latter,
the formation of the gate in the cavity.

The method may further comprise one or more doping steps during the formation of the semiconductor element, such that the semiconductor element comprises at least two stacked zones of different doping, or is doped according to a single type of doping, uniform or not.

According to a variant, the formation of the semiconductor connection element may comprise the deposition of at least one semiconductor layer in the cavity.

The invention also relates to a microelectronic device comprising:
a substrate and a plurality of metal interconnection levels stacked on the substrate,
a first metal line of a given metal interconnection level,
a second metal line of another metal interconnection line located above said given metal interconnection line, said first and second lines being interconnected via at least one semiconductor connection element extending in a direction forming a nonzero angle with said first metal line and second metal line, the device further comprising a gate electrode to control the conduction of said semiconductor connection element. According to the invention, the gate electrode and the semiconductor element may be laid out such that at least one region of the gate electrode is surrounded by the semiconductor element.

Thus, control of the current flowing through the semiconductor via is implemented by means of at least one region of the gate electrode being surrounded by the semiconductor element.

The device according to the invention implements one or more programmable semiconductor vias, optionally made of monocrystalline semiconductor material, to enable this or these via(s) to play the role of channel or channels of a transistor.

According to an implementation possibility, the semiconductor element may be formed of several nano-wires arranged around said gate electrode region.

"Nano-wire" is taken to mean a rod of critical dimension comprised between around 5 nm and 500 nm diameter.

According to another implementation, the semiconductor element may be formed of a semiconductor layer surrounding the gate electrode.

The first metal line and the second metal line may be located respectively in a first plane and a second plane parallel to the first plane. Said region of the gate electrode surrounded by the semiconductor element may be connected to a portion of electrically conductive material in the form of a line located in a plane parallel to the first plane and to the second plane.

Said portion of electrically conductive material can enable an easy contact on the gate.

The first metal line and the second metal line can extend in different directions, said portion of electrically conductive material in the form of a line that can extend in another direction, different to those in which the first metal line and the second metal line extend respectively. Such an arrangement makes it possible to limit capacitive effects in the device.

The gate electrode may be connected to a portion of electrically conductive material in the form of a metal line of a metal interconnection line other than the metal interconnection levels of the first metal line and of the second metal line.

According to an implementation possibility, the semiconductor element may be in direct contact with the first metal line and/or the second metal line.

According to a variant, the semiconductor element may be in contact with a first zone, semiconductor or metal, itself in contact with the first metal line and/or be in contact with a second zone, semiconductor or metal, itself in contact with the second metal line.

Such a device may, according to an application example, be implemented in a FGPA type reconfigurable circuit, in order to reconfigure the connections between basic logic blocks.

In a 3D (three dimensions) architecture comprising for example, on a same chip, logic function blocks and/or memory type blocks and/or optic communication blocks and/or sensor type blocks, such programmable vias can serve as elements for repairing errors for memory type blocks, data encryption elements or instead perform programmable logic functions.

In addition, in a 3D architecture, such programmable vias may be integrated on one or more levels.

BRIEF DESCRIPTION OF DRAWINGS

The present invention will be better understood on reading the description of embodiment examples given purely as an indication and in no way limiting, and by referring to the appended drawings in which.

Identical, similar or equivalent parts of the different figures bear the same numerical references so as to make it easier to go from one figure to the next.

The different parts represented in the figures are not necessary shown according to a uniform scale, in order to make the figures more legible.

DETAILED DESCRIPTION OF PARTICULAR EMBODIMENTS

Figure 1:
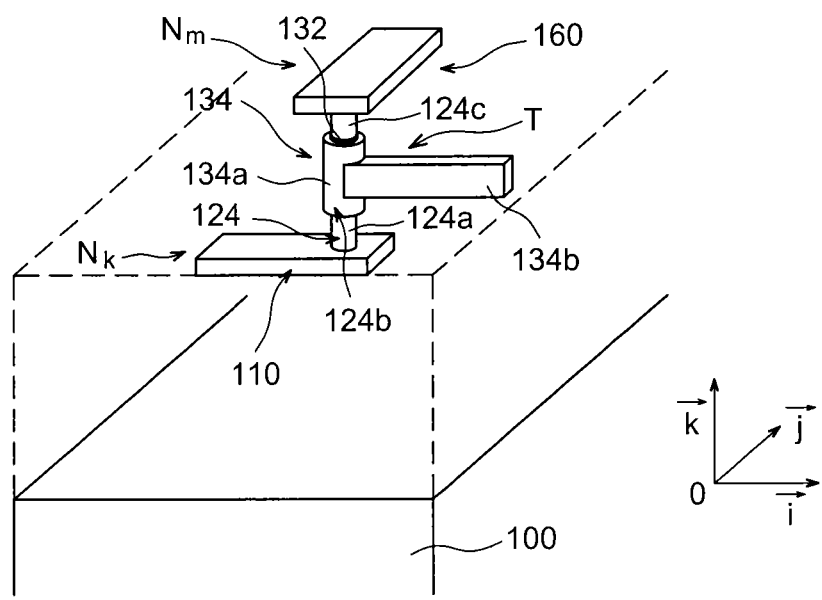
FIG. 1 illustrates a first example of microelectronic device equipped with a programmable semiconductor via, the conduction of which is controlled by a transistor having a vertical structure.

An example of microelectronic device provided with a vertical interconnection element commonly known as commanded semiconductor "via" is given in FIG. 1.

Said device is formed on a substrate 100 on which a plurality of components (not represented) and of stacked metal interconnection levels of the components have been formed.

Each metal interconnection line comprises one or more horizontal metal lines, for example based on copper.

A horizontal metal line of a metal level is connected to another horizontal metal line of an upper and/or lower level via one or more vertical connection elements commonly known as vias.

"Horizontal" is taken to mean a direction parallel to the principal plane of the substrate 100 in other words a plane passing through the substrate and parallel to the plane $[O; \vec{i}; \vec{j}]$ of an orthogonal mark $[O; \vec{i}; \vec{j}; \vec{k}]$ given in FIG. 1.

"Vertical" is taken to mean a direction forming a nonzero angle with the principal plane of the substrate 100, on which the device is formed, in other words a direction forming a nonzero angle with the plane $[O; \vec{i}; \vec{j}]$ of the orthogonal mark $[O; \vec{i}; \vec{j}; \vec{k}]$ given in FIG. 1.

Said device particularly comprises a first horizontal metal line 110 of a given metal level $N_k$ (with k a nonzero integer less than a integer p) connected, via a vertical connection element 124, to a horizontal metal line 160 of an upper metal level $N_m$ (with k<m≤p).

Said vertical connection element 124, is in the form of a rod or a nano-wire, based on semiconductor material, for example based on Si.

A zone 124b of the vertical connection element 124 is surrounded by a zone 132 of gate dielectric, for example based on $HfO_2$ or $Al_2O_3$, said dielectric zone 132 being itself covered with a portion 134a of a gate, or coating gate electrode 134, surrounding the element 124.

The gate 134 may also comprise another portion 134b which is joined to the coating portion 134a, and which extends in the horizontal direction.

The gate 134 makes it possible, as a function of the potential that is applied thereto, to control the circulation of current between the metal lines 110 and 160 by controlling the conduction of the element 124.

Zones 124a and 124c of the semiconductor connection element 124, located on either side of the zone 124b, play respectively the role of source and drain zone of a transistor T, whereas the zone 124b forms a channel of said transistor, the conduction of which is controlled by the gate 134.

The transistor T makes it possible, depending on the way in which the gate 134 is polarised, to modulate a current transiting between the metal lines 110 and 160.

The transistor T may be provided to play the role of controlled switch in order to allow the current to flow or not between the metal lines 110 and 160.

The transistor T may also be provided to play the role of current amplifier between the metal lines 110 and 160.

The vertical structure transistor thereby formed between the metal lines 110 and 160 may have an operation of the type of that of an MOS transistor.

According to a variant, the position of the drain and the source may be reversed.

According to a particular implementation of said device, the metal lines 110, 160 and the horizontal gate portion 134b may be arranged such that they extend in three different directions.

Such an arrangement makes it possible to minimise the capacitive effects between said three elements 110, 160 and 134b.

A first example of method for producing a microelectronic device of the type of that described previously with reference to FIG. 1 will now be given with reference to FIGS. 2A-2R.

Figure 2A:
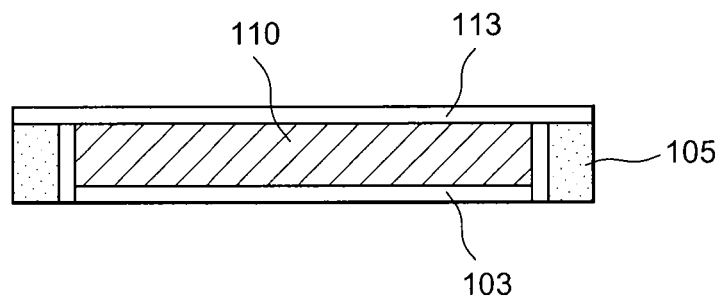
FIGS. 2A-2R illustrate an example of method for producing a microelectronic device equipped with a semiconductor via, the conduction of which is controlled by a transistor.

In FIG. 2A, a horizontal metal line 110 of a metal interconnection line belonging to a device in the course of being made is represented. The device comprises a substrate (not represented) on which components have been formed, for example transistors, or components of a logic circuit (the components not being represented).

Said metal line 110 may have been formed in a dielectric layer 105, for example based on $SiO_2$. In addition, in the example described here, a barrier layer 103, for example based on CoWP or TiN or TaN, is arranged between the metal line 110 and the dielectric layer 105.

The metal line 110 is covered with an insulating encapsulation layer 113, for example based on silicon nitride or silicon carbide, provided to protect the latter, and which could serve as etching stop layer (FIG. 2A).

A dielectric layer 115 is then deposited, for example based on $SiO_2$. The dielectric layer 115 may be deposited for example by physical process from a gaseous precursor for example of $SiH_4$ type, or a liquid precursor for example of Tetra Ethyl Ortho Silane type. The thickness of the dielectric layer 115 corresponds to the distance separating two metal interconnection levels and to the height provided for one or more vertical interconnection elements, commonly known as vias, intended to connect said levels. The dielectric layer 115 may have for example a thickness comprised between around 30 nm and 1500 nm.

A cavity 119 is then formed in the dielectric layer 115.

Figure 2B:
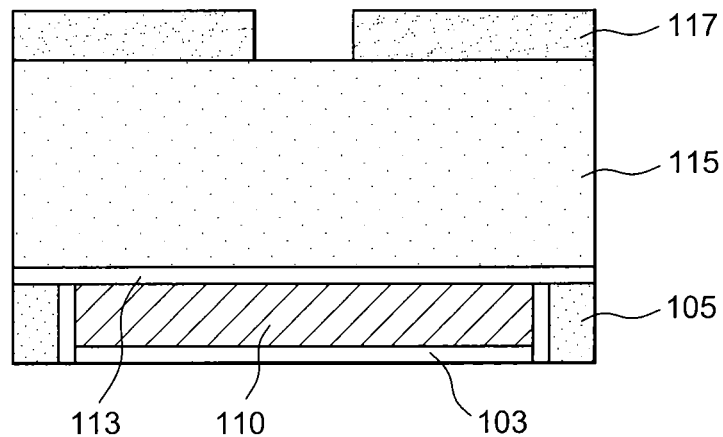

To this end, a masking 117 is firstly formed, forming a hard mask for example based on resin, on the dielectric layer 115 (FIG. 2B).

A step of physical etching, for example of RIE (Reactive Ion Etching) type, with stoppage on the protection layer 113 may be carried out in order to transfer the pattern of the masking 117 in the dielectric layer 115.

Figure 2C:
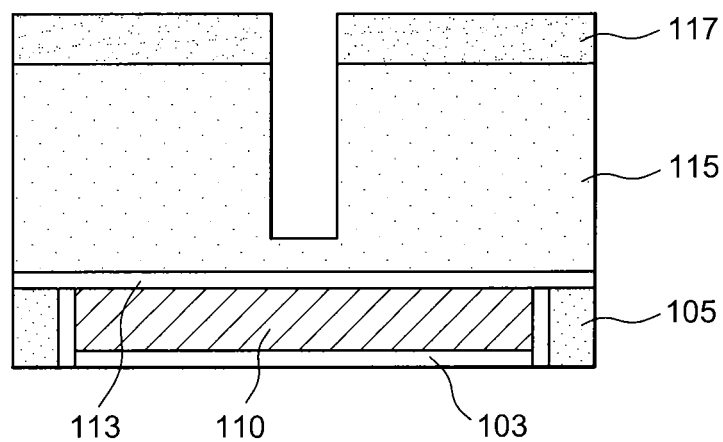

A variant consists in carrying out a first etching so as to form a hole, the bottom of which is located in the dielectric layer 115, without reaching the encapsulation layer 113 (FIG. 2C). This makes it possible not to deteriorate the upper face of the encapsulation layer 113 when the etching is a dry etching.

For this variant, the first etching is then followed by a second etching, in order to widen the hole and reach the encapsulation layer 113. Said second etching may be for example a wet etching based on HF when the dielectric layer 115 is based on silicon oxide.

Figure 2D:
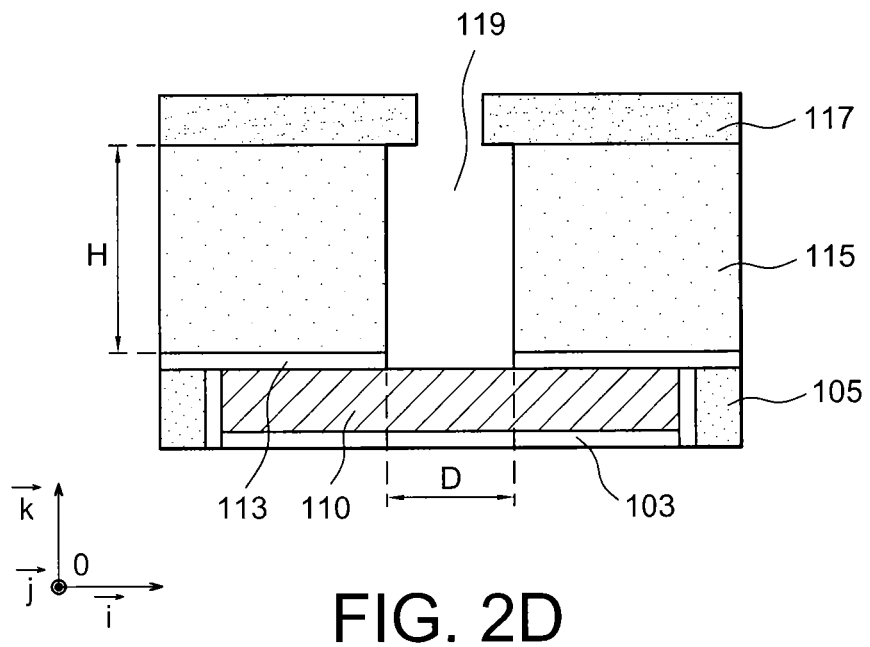

An etching of the encapsulation layer 113 may then be carried out, so as to expose the metal interconnection line 110 (FIG. 2D).

To form a cavity 119 having an important form factor (diameter D/height H), for example at least equal to 4, a prior step of treatment by means of an $O_2$ plasma may make it possible to render the sides of the patterns of the masking 117 hydrophilic. This may be followed by a step of pre-wetting in de-ionised water.

A cavity 119 of critical dimension or diameter D (measured in the direction parallel to the plane [O; $\vec{i}$; $\vec{j}$] of an orthogonal mark [O; $\vec{i}$; $\vec{j}$; $\vec{k}$] indicated in FIG. 2D) comprised for example between 150 nanometers and 200 nanometers may thereby be formed.

The cavity 119 may have a height H (measured in the direction parallel to the vector k of the orthogonal mark [O; $\vec{i}$; $\vec{j}$; $\vec{k}$] comprised for example between around 30 nanometers and 1500 nanometers.

A step of removing the masking 117 of the resin commonly known as "stripping" and cleaning for example based on HF to remove the residues, particularly residues of polymer(s) which may have been formed during preceding etching steps, may be optionally carried out.

Such a cleaning of the surface of the metal line 110 may be useful for the preparation of the later deposition of a catalyst.

Then, a step of deposition of said catalyst 121 is carried out at the bottom of the cavity 119. The growth catalyst 121 may be for example copper, or aluminium, or indium, or nickel. The thickness of said catalyst 121 is adapted as a function of the characteristics of the nano-wire(s) intended to be formed from said catalyst 121 to form the via. For example, when the catalyst 121 is based on gold and when it is wished to form a single nano-wire filling the entire volume of the cavity 119, and when the diameter D of the cavity 119 is equal to around 50 nm, the catalyst 121 may have a thickness (dimension parallel to the axis k) greater than or equal to around 25 nm.

The catalyst 121 is deposited at the bottom of the cavity 119, preferably without the walls 120 of the cavity 119, corresponding to the sides of the dielectric layer 115, being covered. To this end, according to a first possibility, a deposition of catalyst on the metal line 110, selective vis-à-vis the dielectric layer 115, may be carried out.

Said selective deposition may be for example an electrochemical deposition in the case where a contact on the metal line is provided, or instead by a selective deposition by electroless process (chemical) not requiring contact being made on the metal line.

The surface condition of the metal line 110 being of particular importance for the success of the deposition of the catalyst, a pre-treatment of the metal line 110 may be optionally carried out, in order to remove what could prevent the electrochemical deposition of the catalyst. For example, for a metal line of copper, a pre-treatment with sulphuric acid may be carried out in order to remove potential oxidised copper zones.

According to a variant, a non-selective deposition of the catalyst, for example a physical evaporation deposition, may be carried out.

In this case, in order to protect the walls 120 of the cavity 119 during the deposition of the catalyst, a masking is provided, which may be the masking 117 in the case where the latter has been conserved, or another masking, that is formed prior to the deposition.

Figure 2E:
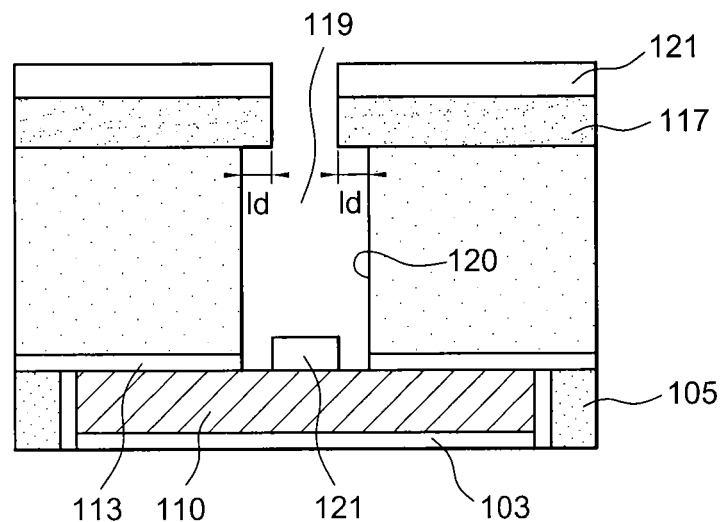

In both cases, the masking may have been carried out such that portions thereof extend over the cavity 119 and overhang said cavity (FIG. 2E).

The length $1_d$ (measured in a direction parallel to the plane [O; $\vec{i}$; $\vec{j}$] of the orthogonal mark [O; $\vec{i}$; $\vec{j}$; $\vec{k}$]) of the extension of the masking 117 over the cavity 119 is provided as a function of the height H of the cavity 119, and may be provided such that $1_d \geq (1/10)*H$, for example of the order of 50 nm for a cavity of 500 nm height.

In the case where the masking 117 has been conserved, the overhang may have been formed during said second step of etching carried out to form the cavity 119, and which has been described previously with reference to FIG. 2D.

In the case where the first step of etching of the dielectric layer 115 described previously with FIG. 2C has made it possible to form an opening of 150 nm diameter and so as to leave 30 nm of the dielectric layer 115 at the bottom, followed by a second step of wet etching, it is possible to have obtained a cavity 119 of 250 nm diameter D with the walls protected by a masking resin 117 extending beyond by an extension length $1_d$ of the order of 50 nm.

Another variant consists in forming the cavity 119 and the deposition of catalyst, through a masking 117 in the form of a hard metal mask, for example based on TiN.

In this case, the masking may be provided with a thickness at least equal to the tenth of the thickness of the dielectric layer 115 in order not to be entirely consumed during the formation of the cavity in the dielectric layer 115.

Then, after having deposited the catalyst 121, the portions of said catalyst 121 on the masking 117 are removed while conserving a block 121b of catalyst at the bottom of the cavity 119.

Figure 2F:
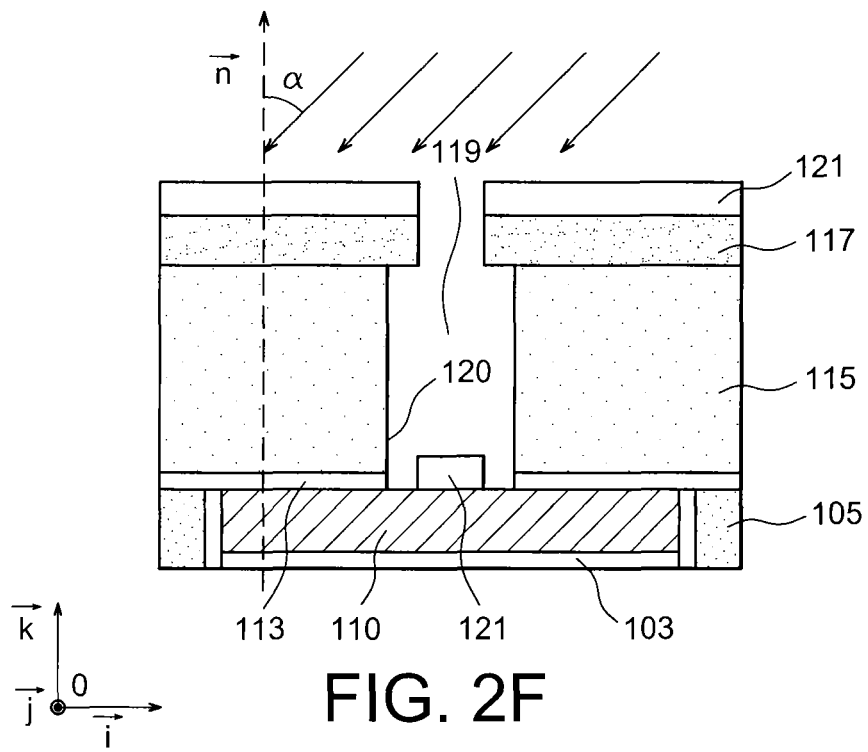

This selective removal may be carried out by means of ion etching, for example by IBE (Ion Beam Etching) by means of an inclined beam forming a nonzero angle α with respect to a normal $\vec{n}$ to the principal plane of the dielectric layer 115 (the principal plane of the dielectric layer 115 being defined by a plane passing through said layer and parallel to the plane [O; $\vec{i}$; $\vec{j}$] of an orthogonal [O; $\vec{i}$; $\vec{j}$; $\vec{k}$] in FIG. 2F).

For a cavity 119 having a form factor (depth/diameter) at least equal to 1, an angle α of at least 45° may be provided.

This makes it possible to carry out an efficient removal of the catalyst 121 present on the masking 117 and to avoid removing the catalyst 121 present at the bottom of the cavity 119.

Figure 2G:
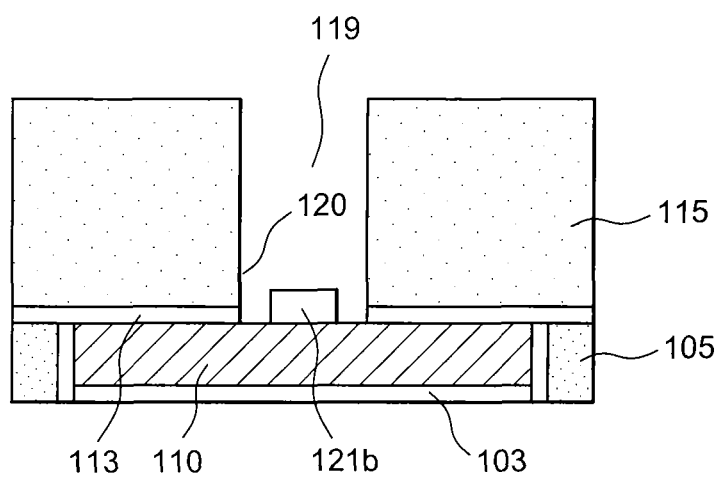

The masking may then be removed, for example by means of a solvent and/or a plasma (FIG. 2G).

Then, a growth of a semiconductor element 124 is carried out in the cavity 119, by means of the block 121b of catalyst 121. The semiconductor element 124 may be in the form of a rod or a nano-wire.

Said growth may be carried out in a CVD (Chemical Vapour Deposition) apparatus and may take place in two or three steps.

Firstly, an annealing under inert atmosphere is carried out. Depending on the catalyst used, a step of pre-treatment of the catalyst may be implemented, such as for example a treatment with hydrogen radicals when the catalyst is based on aluminium or indium, or an oxidation when the catalyst is based on copper. Then a growth is carried out under an atmosphere containing a precursor gas of the semiconductor material that it is wished to grow, for example $SiH_4$, $SiCl_2$ or $SiCl_4$ in the case where it is wished to grow Si.

The temperature at which the growth is carried out may be chosen as a function of the catalyst and the precursor gas used.

The growth temperature may be for example provided between around 350° C. and 450° C., in particular in the case where the catalyst is based on aluminium and where the precursor is $SiH_4$. Such a range of temperatures makes it possible not to degrade the metal lines in the environment of the programmable via.

A plasma may be optionally used during the growth. This makes it possible to compensate the limitations in temperature imposed by the growth on the metal.

For growth by means of a precursor based on $SiH_4$, HCl may be added to the gaseous mixture in order to avoid the diffusion of the catalyst on the sides of the nano-wire during its growth and to limit the undesired deposition of non-catalysed silicon around the growing nano-wire.

It is possible to dope the semiconductor element 124 and to confer on it a particular doping profile when it is made to grow, by carrying out an in-situ doping during the growth.

The doping parameters may be such as those used for example in the document: "*Vertically aligned Si intrananowire p-n diodes by large-area epitaxial growth*", of Cheol-Joo Kim, Donghun Lee, Hyun-Seung Lee, Geunhee Lee, Gil-Sung Kim, and Moon-Ho Jo, Applied Physics Letters, 94, 2009.

The semiconductor element 124 may be formed for example with a first zone 124a, surmounted by a second zone 124b having a different doping to that of the first zone 124a, the second zone 124b being itself surmounted by a third zone 124c having a different doping to that of the second zone 124b.

Different doping profiles may be produced.

A doping profile for which, for example, the semiconductor zone comprises a first P-doped zone 124a surmounted by a second N-doped zone 124b, itself surmounted by a third P-doped zone, may be carried out.

According to other possibilities, a N-P-N profile, or a N-I-P profile (where I designates an intrinsic portion, in other words a non-doped zone), may be implemented. According to another possibility, it is also possible that the whole of the semiconductor element is doped according to a same type of doping, uniform or not. In this case, the semiconductor element 124 forms the active zone of a depletion MOS transistor.

Figure 2H:
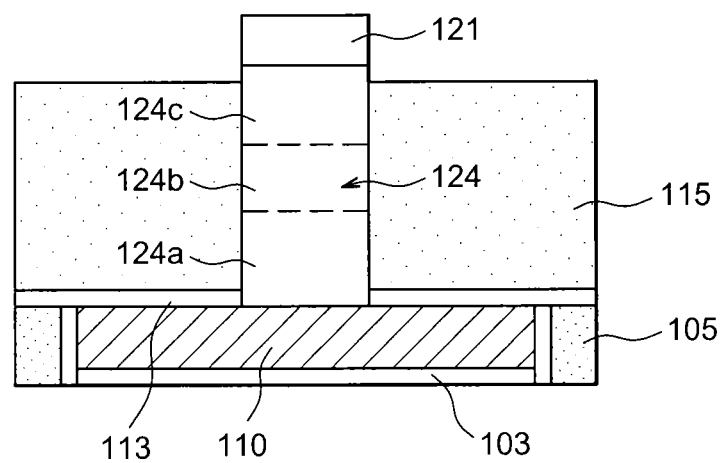

The semiconductor element 124 is guided during its growth by the cavity 119 which, in this example, imposes thereon its diameter, and its direction orthogonal to the metal line 110 on which it grows. The height of the semiconductor element 124 is determined by the growth time at a given growth rate (FIG. 2H).

The semiconductor element 124 may have a height for example comprised between 30 nm and 1500 nm. The growth time is provided such that the semiconductor element 124 reaches at least the mouth of the cavity 119 at the level of the upper face of the dielectric layer 115.

After said growth step, a thickness of the dielectric layer 115 in which the cavity 119 is formed and having served as guiding for the growth is removed.

Figure 2I:
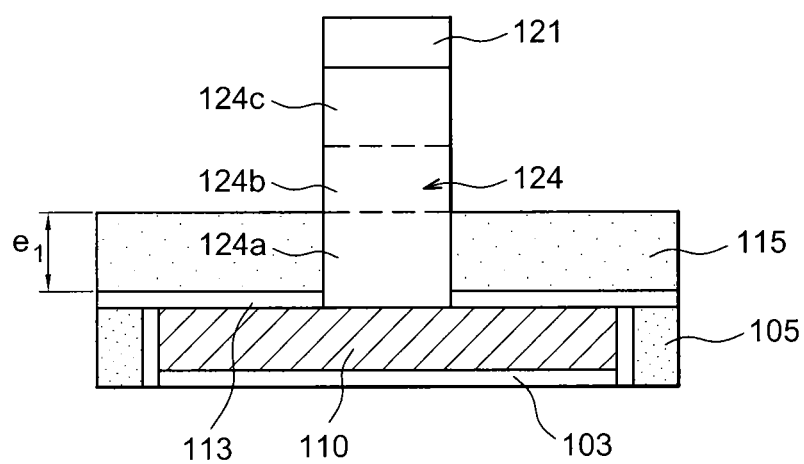

Said partial removal is carried out so as to conserve a thickness $e_1$ of said dielectric layer 115 around the semiconductor zone 124 (FIG. 2I).

The partial removal may be carried out by etching, for example by a BOE (Buffered Oxide Etchant) containing ammonium fluoride and hydrofluoric acid to etch the silicon oxide.

The partial removal of the dielectric layer 115 may be carried out such that the upper face of the remaining thickness of the dielectric layer 115 is located at the same height, or substantially at the same height, as the interface between the first zone 124a and the second zone 124b of the semiconductor element 124.

The zone 124a of the semiconductor element 124 may be intended to form a source region of a transistor. Thus, the step of partial removal of the dielectric layer 115 may be carried out so as to conserve a thickness $e_1$ corresponding to the thickness provided for the source zone of a transistor (FIG. 2I).

After etching of the dielectric layer 115, a step of removal of the residues of the catalyst is carried out. When the catalyst is gold, said removal may be carried out by means of an aqua regia bath, or a solution based on halides of a cation for example a solution of KBr, or KI. The metal catalyst 121 is thus removed at the top of the semiconductor element 124 in order to avoid any contamination of the device and equipment in which said device is intended to be placed during its manufacture.

Figure 2J:
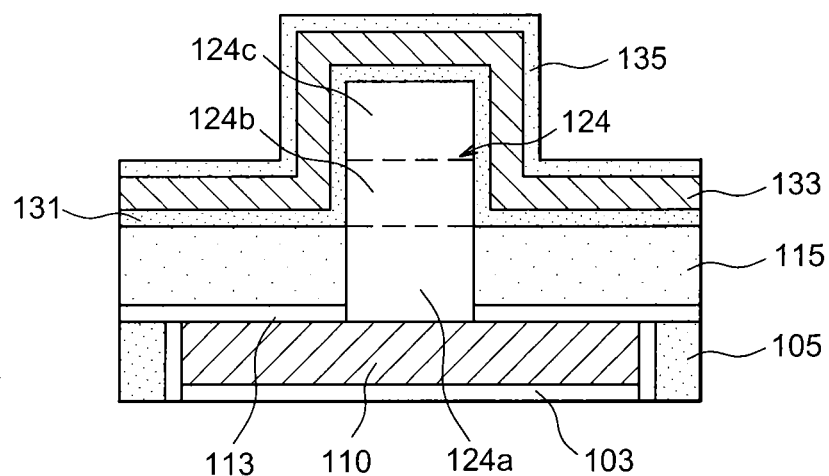

A stack of layers 131, 133, 135 is then formed on the semiconductor zone 124 and on the dielectric layer 115 (FIG. 2J).

To this end, a deposition of dielectric gate material 131 is firstly carried out. The deposition may be performed in an ALCVD (Atomic Layer Chemical Vapour Deposition) apparatus in order to deposit a dielectric 131 of type commonly known as "high-k" such as, for example, $HfO_2$, or $Al_2O_3$, according to a thickness for example of the order of 3 nanometers. Such a deposition may be carried out at a temperature comprised for example between around 80° C. and 425° C. In order to improve the electrical insulation qualities of the dielectric material 131, preferably said deposition is carried out at a temperature comprised between around 370° C. and 400° C., thereby facilitating the exo-diffusion of the reaction intermediates in the case of a deposition carried out by ALCVD.

Then, a deposition of gate material 133 is carried out. The gate material 133 may be a metal material. The gate material may be for example TiN or aluminium or chromium. When said gate material 133 is TiN, it is preferably deposited by CVD, according to a thickness for example of the order of 50 nm. Such a deposition may be carried out at a temperature comprised, for example, between around 25° C. and 400° C. In order to obtain a very conformal deposition of the gate material 133, when it is TiN, this may be deposited from a TDMAT (Tetrakis Dimethylamino Titanium) type precursor at a temperature comprised between around 350° C. and 400° C., at a pressure comprised between around 4 and 6 torrs and under an atmosphere containing for example the gases He, $N_2$ and $H_2$.

On said gate material 133 is then formed an etching stop layer 135, for example silicon nitride based. Said etching stop layer 135 is provided with a sufficient thickness to ensure later the role of buffer during etching intended to be carried out to form contacts, in particular contacts to the gate and to the level of the lower part of the semiconductor element 124.

Figure 2K:
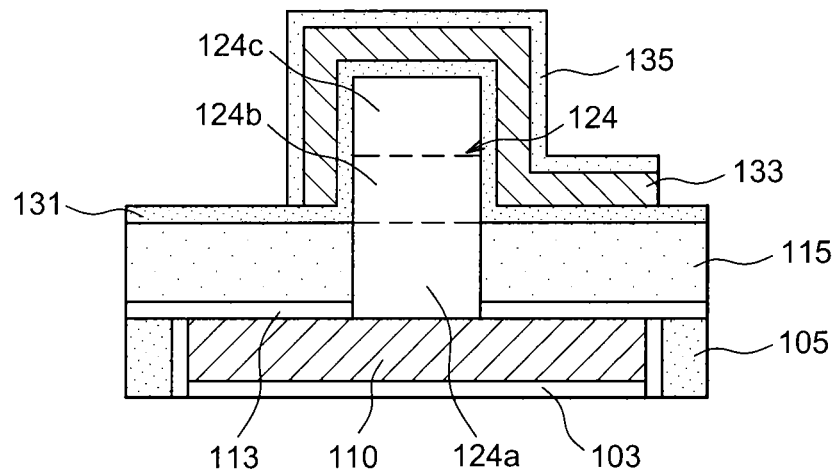

Then are removed, for example by photolithography and etching, on the dielectric layer 115, portions of the etching stop layer 135 and the layer of gate material 133 (FIG. 2K).

Figure 2L:
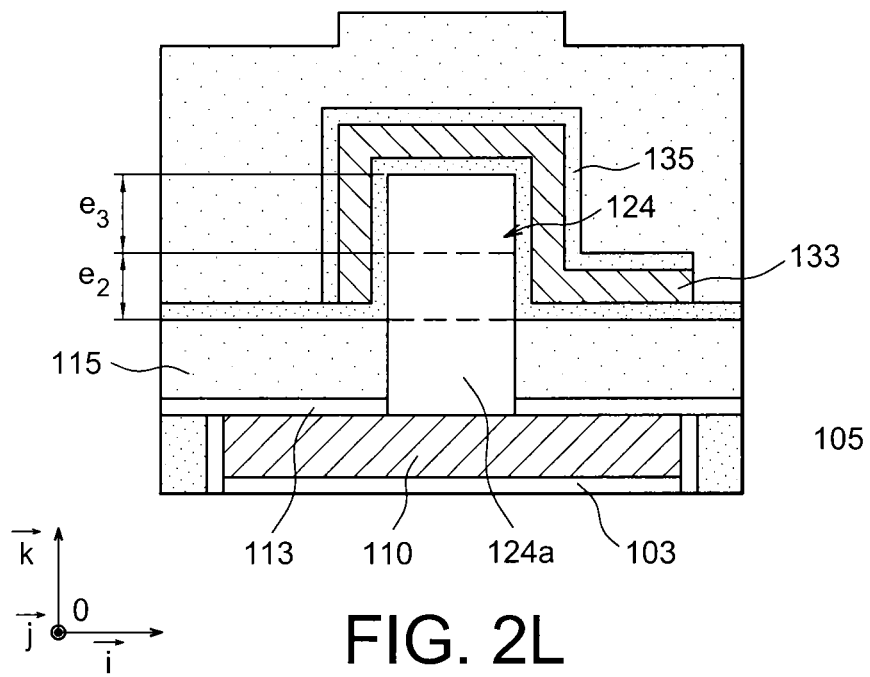

A deposition of a dielectric layer 137, for example based on $SiO_2$, is then carried out so as to cover the stack of layers 131, 133, 135 (FIG. 2L).

The thickness of the dielectric layer 137 may be provided with a thickness greater than the total thickness $e_2+e_3$ of the zones 124b and 124c of the semiconductor element 124, and which are intended respectively to form a channel zone and a drain zone of the transistor. The dielectric layer 137 may be for example of the order of 50 nm to 100 nm thicker than the total length $e_2+e_3$ of the channel zone and the drain zone of the transistor.

Figure 2M:
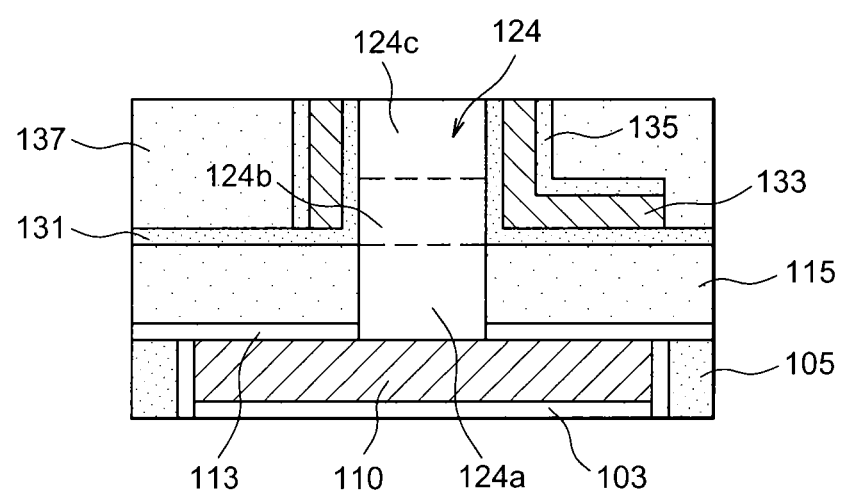

Said deposition step may be followed by a step consisting in levelling the dielectric layer 137 by chemical-mechanical polishing, then removing the stack constituted of the gate dielectric 131, gate material 133, and the layer 135 located above the semiconductor zone 124. The parts of the stack located around the semiconductor zone 124 are for their part conserved (FIG. 2M).

Figure 2N:
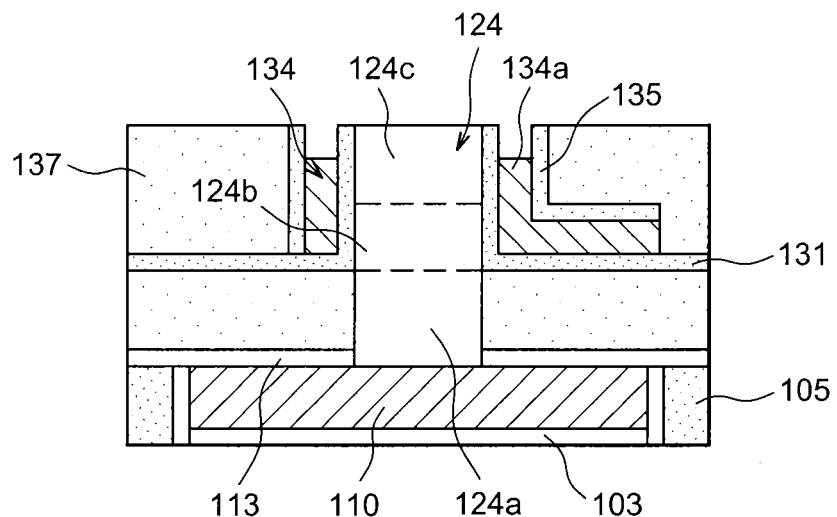

A selective removal of a portion of gate material 133 is then carried out, so as to finish the formation of the gate pattern 134 and provide an insulation between said gate 134 and an upper contact intended to be formed later (FIG. 2N).

The gate 134 thereby formed comprises a portion 134a coating the semiconductor zone 124b, and another portion 134b, joined to the coating portion 134a, and which extends on the dielectric layer 115 in a horizontal direction.

In the case, for example, where the gate material 133 is based on TiN, a chemical solution based on 1 volume of $NH_4OH$ for 2 volumes of $H_2O$ and 2 volumes of $H_2O_2$ may be used to carry out this selective removal.

Figure 2O:
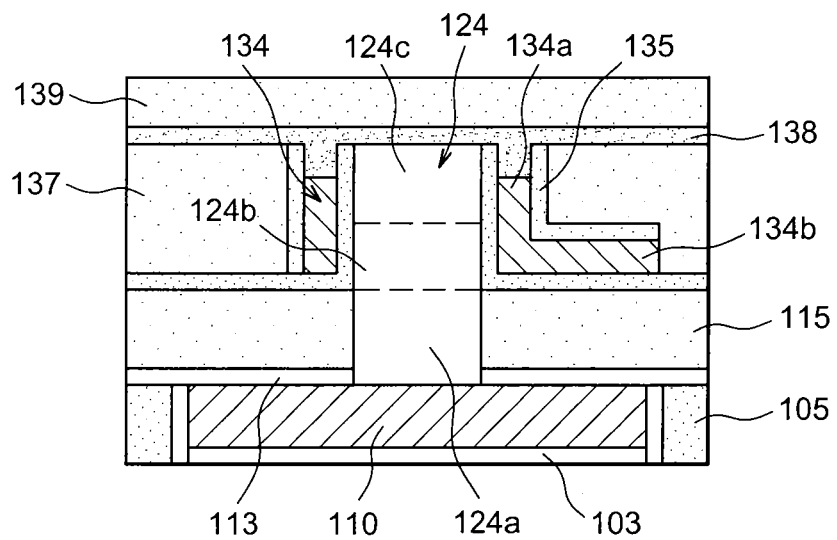

Then (FIG. 2O), a conformal deposition, forming an etching stop layer 138 for example based on silicon nitride, is advantageously implemented to cover all of the elements formed previously which form the upper surface of the assembly represented in FIG. 2N, namely the semiconductor nano-wire 124, the dielectric layer 137, portions of the gate dielectric 131 and the etching stop layer 135, and fill the empty spaces obtained during the preceding etching of the gate material 133. The thickness of the conformal layer 138 is preferably greater than or equal to around 30 nm when it is wished to form an upper metal line or level $N_m$ of thickness at least equal to around 300 nm. Said conformal layer 138, which makes it possible not to deteriorate the top of the semiconductor nano-wire 124 on which will be made the electrical contact, is then covered with a dielectric layer 139, for example based on oxide such as $SiO_2$. Said deposition may be followed by a step of chemical mechanical polishing CMP in order to render flat the surface of the dielectric layer 139, and thereby begin a following step of photolithography in optimal conditions. The initial thickness of the dielectric layer 139 is chosen such that after the implementation of the CMP, the remaining thickness of the dielectric layer 139 is at least equal to the thickness of the upper metal line intended to be formed thereafter.

Figure 2P:
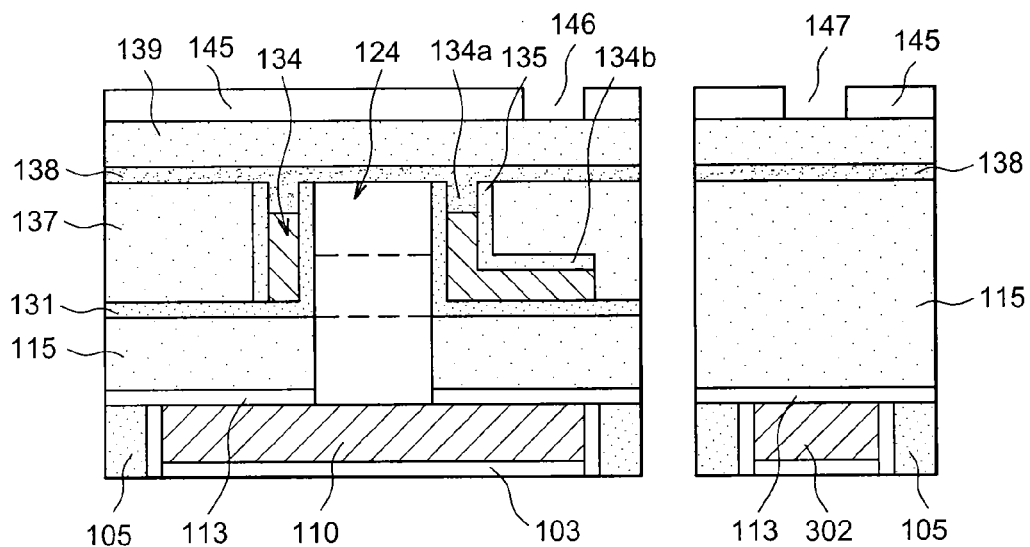

Electrically conductive vias intended to be formed in the dielectric layer 137 are then formed. In the example described here, such a via intended to come into contact with the gate portion 134b is going to be formed. Other vias intended to come into contact with the metal portions of the device located at the same level as the metal line 110 may also be formed by the implementation of the same steps. Thus, in FIG. 2P, a metal portion 302 belonging to the same interconnection level as the metal line 110 is also going to be contacted by an electrically conductive via simultaneously to the via coming into contact with the portion of gate 134b. In an analogous manner to the metal line 110, the metal portion 302 is covered by portions of layers 113, 115, 138 and 139.

To this end, an etching mask 145 is firstly formed, the pattern of which (openings 146 and 147 in the example of FIG. 2P) corresponds to that of the vias intended to be formed.

Figure 2Q:
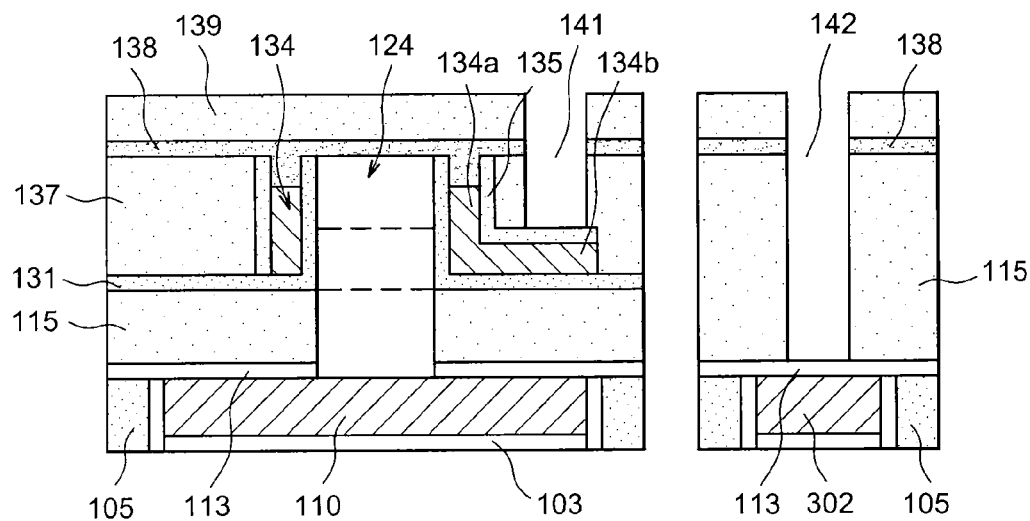
Figure 2R:
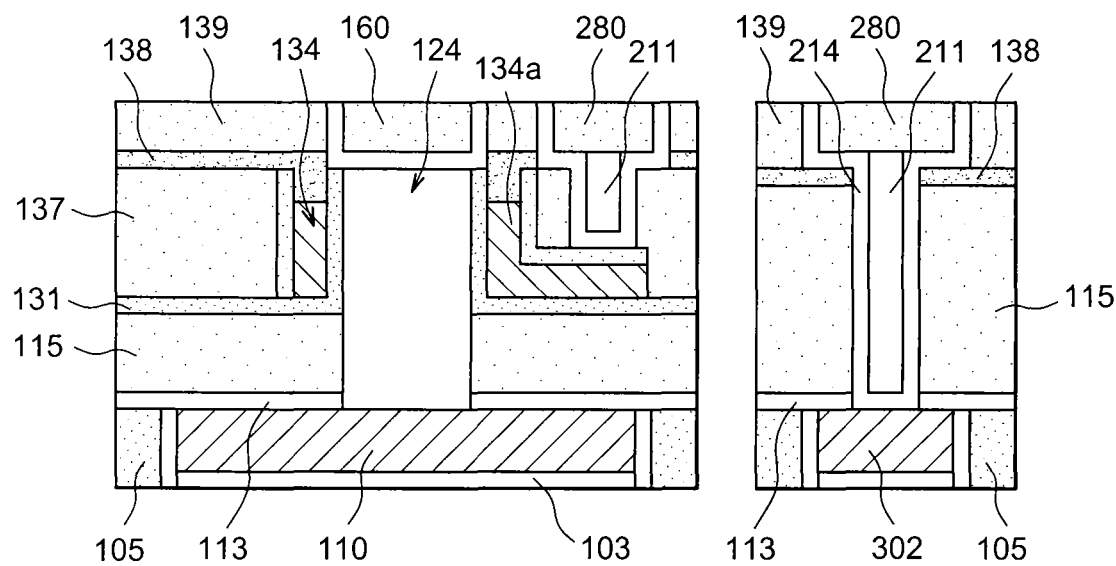

A photolithography and an etching of the portions of the layers 115, 137, 138 and 139 directly in line with the openings 146 and 147 of the mask 145 is then carried out, forming openings 141 and 142 enabling respectively an access to a portion of the etching stop layer 135 covering the portion of gate 134b and an access to the layer 113 covering the metal portion 302 (FIG. 2Q). The thickness of the etching stop layer 135 will have been chosen to make it possible to continue the etching of the other vias which have a different depth. In the case of a dry etching of oxide, the thickness of the etching stop layer 135 may have a thickness for example comprised between around the thickness of oxide remaining to be etched in the other vias and a twelfth of said thickness of oxide remaining to be etched in the other vias, and preferably equal to around a tenth of said thickness of oxide remaining to be etched in the other vias.

The formation of the vias and upper metal lines is then continued according to "Dual Damascene" technology, for example described in the document "Silicon processing for the VLSI Era", vol. 4, pages 674-679.

Thus, the portions of the layers 138 and 139 covering the semiconductor nano-wire 124 are firstly etched. Said etching can make it possible to widen the openings 141 and 142 at the level of the layer 139. The deposition is then carried out of a barrier layer 214, for example based on TiN deposition by CVD or based on TaN/Ta or Ta alone covered with a tie layer based on copper deposited by PVD (physical vapour deposition), in the openings 141 and 142 as well as on the nano-wire 124 laid bare. Then are formed the metal vias 211, the metal line 160 contacting the semiconductor nano-wire 124, as well as other portions 280 of the upper metal level contacting the metal vias 211, for example by electrodeposition of copper and CMP (FIG. 2R).

All of the metal lines (referenced 160 and 280 in FIG. 2R) of the upper metal level are thus formed simultaneously by the implementation of common "Dual Damascene" steps.

Advantageously, it is possible to form, prior to the step of filling with copper, a silicide at temperature, for example based on NiSi, at the top of the nano-wire 124, making it possible to improve the quality of the electrical contact between the nano-wire 124 and the metal line 210.

In a variant of the "Via First" approach described previously, it is possible to implement a "Trench First" approach consisting in firstly etching the portions of the layers 138, 139 located at the top of the nano-wire 124, then forming the openings 141 and 142. Said variant is then finished in an analogous manner to the "Via First" approach.

Figure 3A:
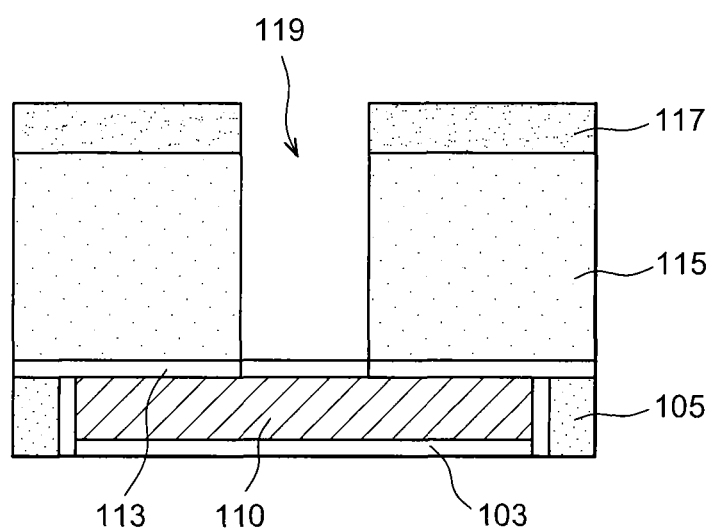
FIGS. 3A-3B illustrate an embodiment variant of a semiconductor via, by growth on a metal line without addition of catalyst.
Figure 3B:
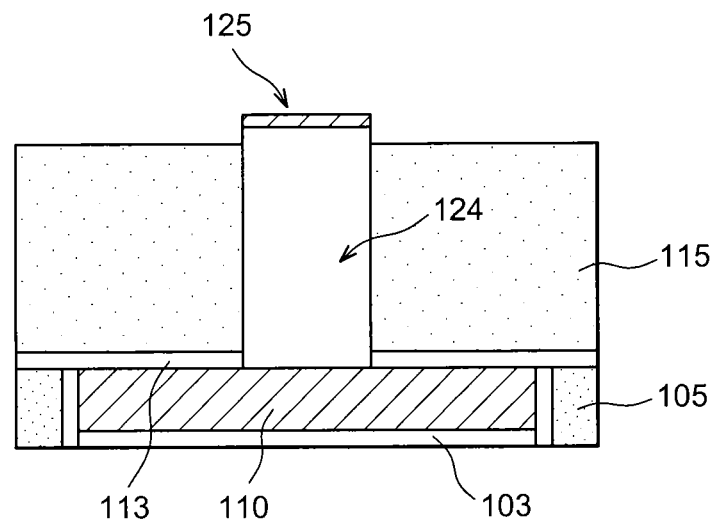

A variant (FIGS. 3A-3B) of the example of method that has been described consists in using directly the metal of the metal line 110 as growth catalyst. In the case where said metal line 110 is made of copper or aluminium (FIG. 3A), the growth of the semiconductor element 124 may be carried out directly on said line 110. In this case, a part 125 of the metal of the metal line 110 serving for the growth is found, at the end of the growth, at the top of the semiconductor element 124 and makes it possible to form a metal contact (FIG. 3B).

In the examples that have been described previously, the semiconductor element 124 forming a via is made to grow, by using a cavity to which said element 124 has a complementary the shape, then a gate electrode is formed around said conductor element. An example of embodiment of a microelectronic device according to the invention is illustrated in FIGS. 4A-4B.

Said device is formed on a substrate (not represented) on which a plurality of components (not represented) and metal interconnection levels of the components have been formed.

Figure 4A:
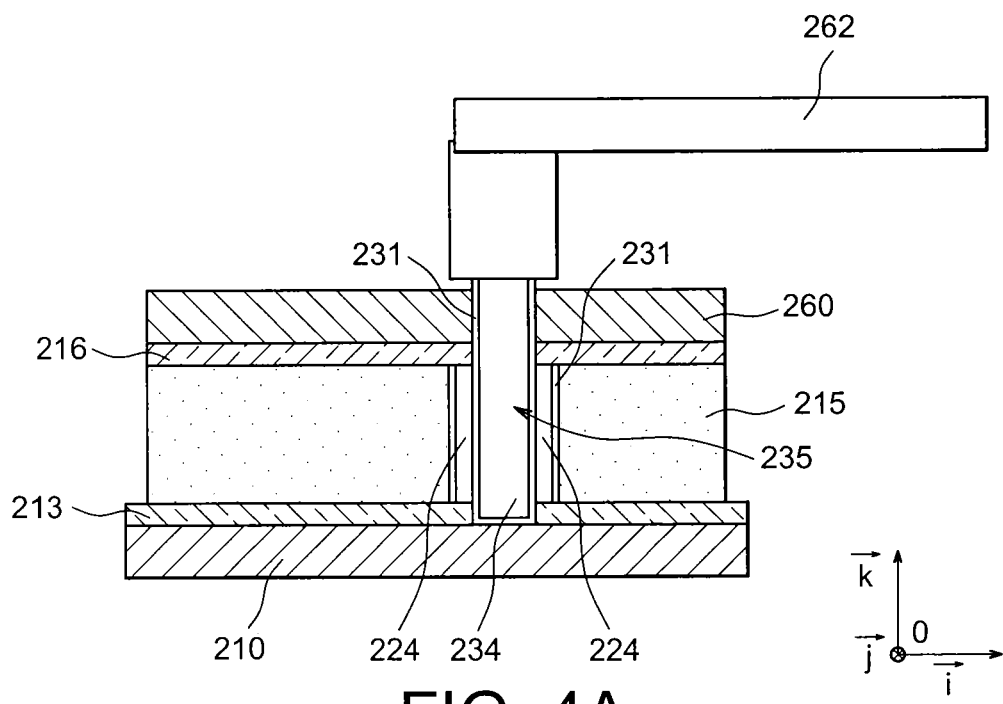
FIGS. 4A and 4B illustrate an example of microelectronic device according to the invention, equipped with a programmable semiconductor via in the form of a plurality of nano-wires, the conduction of which is controlled by a transistor having a vertical structure.
Figure 4B:
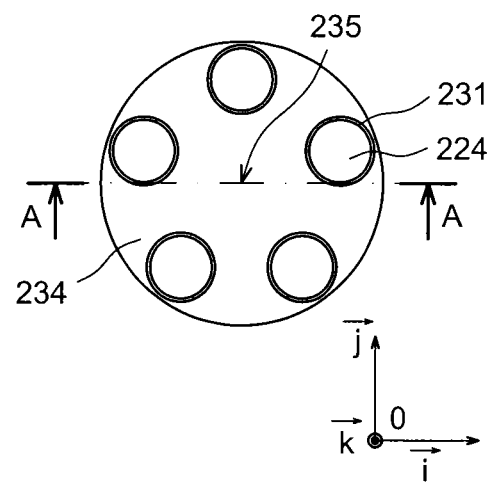

FIG. 4A represents a first horizontal metal line 210 of a given metal level $N_k$ connected via vertical connection elements 224 to a horizontal metal line 260 of an upper metal level $N_m$ (with k<m≤p). Said vertical connection elements 224 may be in the form of a plurality of rods or nano-wires, and are based on semiconductor material, such as for example Si.

The connection elements 224 are each surrounded by a zone based on gate dielectric 231, for example based on a high-k dielectric.

A gate 234 making it possible to control the conduction of the semiconductor connection elements 224 comprises a region 235 surrounded by the semiconductor connection elements 224 (in FIG. 4A, the vertical connection elements 224 are represented according to a sectional view in the plane A-A represented in FIG. 4B).

The connection elements 224 connect a first zone 213 arranged in contact along the horizontal metal line 210 of the given metal level $N_k$, and a second zone 216 arranged in contact along the horizontal metal line 260 of the upper metal level $N_m$.

The zones 213, 216 may be semiconductor and composed of silicon. Said zones may be deposited by PECVD (plasma enhanced chemical vapour deposition). Said zones could advantageously be doped in situ during the deposition and/or recrystallised partially or totally through the implementation of an annealing method at a temperature less than or equal to around 425° C.

The zones 213 and 216 can play respectively the role of source zone and drain zone, or conversely the role of drain zone and source zone. A dielectric layer 215 arranged between the metal lines 210 and 260 of different levels, separates the source and drain zones 213 and 216.

The gate 234 is for its part polarised through a metal line 262 of a metal level $N_n$, above the level $N_m$.

Said gate 234 makes it possible, as a function of the manner in which it is polarised, to control the conduction of the semiconductor connection elements 224.

According to an embodiment variant, the first zone 213 in contact with the first metal line may be metal. The second zone 216 in contact with the second metal line may also be metal.

In order to simplify the positioning and the definition of the gate electrode pattern, it is possible to form said gate electrode by filling in a cavity in which is already arranged the semiconductor element 124.

An example of such an embodiment method will now be given with reference to FIGS. 5A-5C.

Figure 5A:
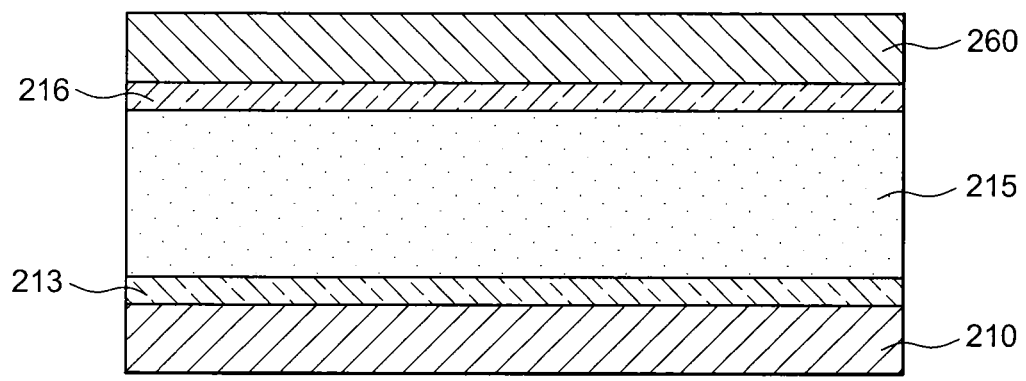
FIGS. 5A-5C illustrate an example of method according to the invention, for producing a microelectronic device equipped with a programmable semiconductor via formed by growth, from a semiconductor zone, of nano-wires, the conduction of which is intended to be controlled by a gate electrode.

In FIG. 5A, the device is shown in the course of being formed.

Said device comprises a substrate (not represented) on which components have been formed, for example transistors or logic circuits (not represented), as well as at least one horizontal metal line 210 of a given metal interconnection level.

The metal line 210 is covered with a stack formed of a first zone 213 which may be semiconductor and for example based on Si, and in which a transistor drain zone is intended to be formed. The semiconductor zone 213 is itself covered with a dielectric layer 215, for example based on SiO$_2$, itself covered with a second zone 216, which may be semiconductor and for example based on Si, and in which a transistor source zone is intended to be formed.

The second zone 216 is itself covered with a horizontal metal line 260 of a metal interconnection line above said given metal interconnection line. The metal line 260 may be for example based on aluminium (FIG. 5A).

Then, a cavity 219 is formed through the metal line 260, the second zone 216, the dielectric layer 215, so as to expose the semiconductor zone 213.

Figure 5B:
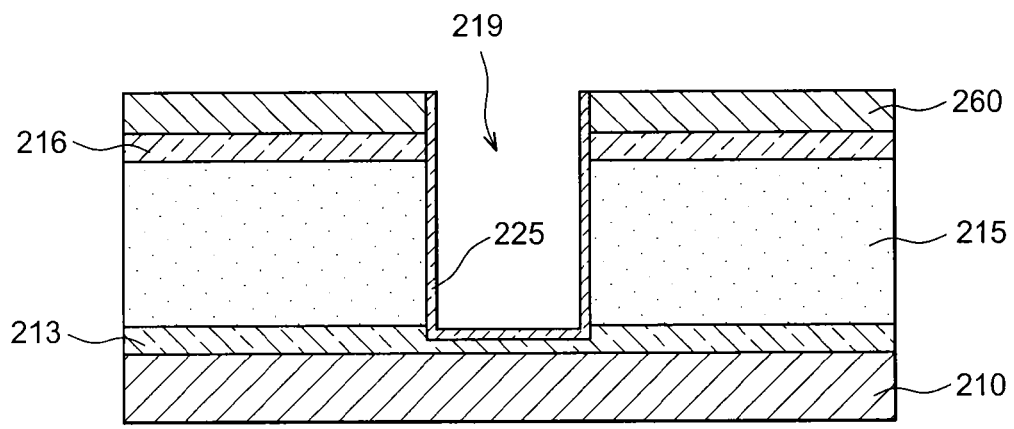

Then, in said cavity 219, a conformal deposition is carried out of a layer 225 of a semiconductor material, for example silicon, advantageously doped, or a silicon-germanium alloy, or silicon carbide (FIG. 5B). Said semiconductor may be monocrystalline or not, deposited by PVD or CVD (chemical vapour deposition) at a temperature less than or equal to around 400° C. A CVD type deposition will be preferred in order to obtain a better conformity of the layer 225.

Then are deposited successively a layer of gate dielectric 231, for example a "high-k" dielectric and gate material 233, for example formed of a bilayer of TiN and Cu or TiN and W. Said materials 231 and 233 cover the semiconductor layer 225.

Then a removal is carried out, for example by polishing of the materials 231, 233 extending beyond the mouth of the cavity. The removal is carried out with stoppage on the metal line 260.

Then, a dielectric layer 237 is formed, for example based on SiO$_2$, in which a conductor pad 253 is formed, for example based on tungsten in contact with the gate material 233.

Figure 5C:
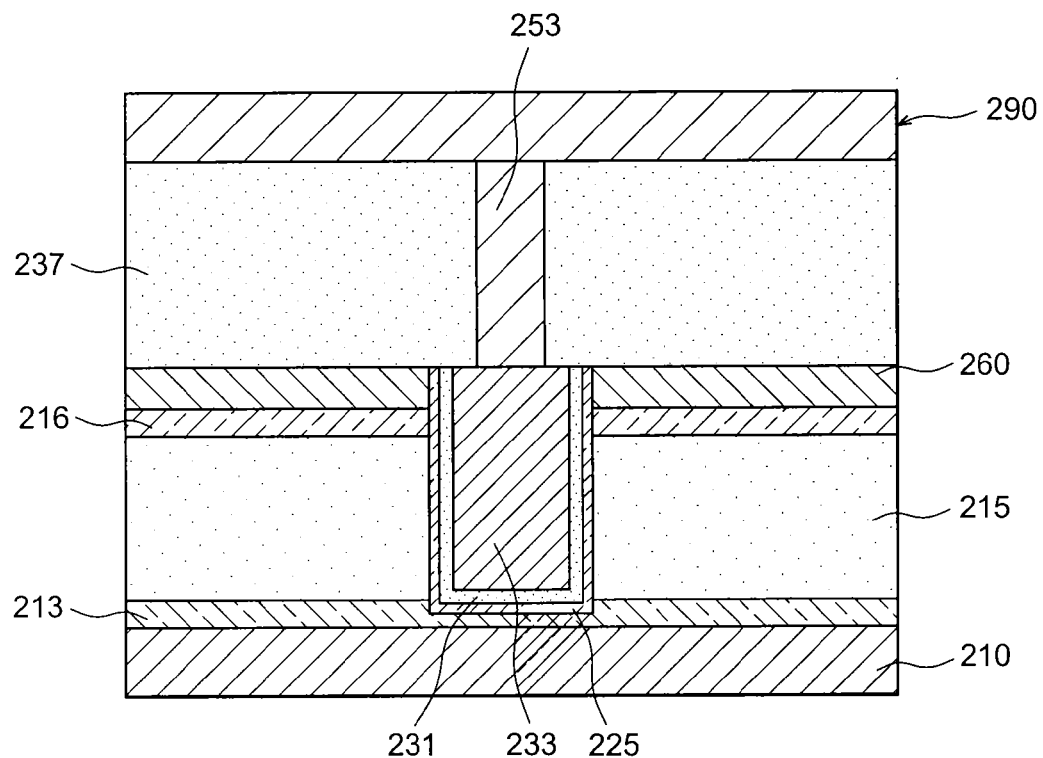

Then a horizontal metal line 290 is formed, for example based on copper, on the dielectric layer 237 (FIG. 5C).

In a variant (not represented) of the example that has been described, particularly in the case where the metal line 260 is based on copper, a metal zone forming a diffusion barrier may be provided around said copper line 260. The diffusion barrier zone may be for example based on TiN or TaN. Thus, the zones 213 and 216 may each also be metal zones, optionally based on metal material, such as Ti, or titanium nitrate, or TaN, serving as diffusion barrier to the metal of the metal lines 210 and 260.

Figure 6A:
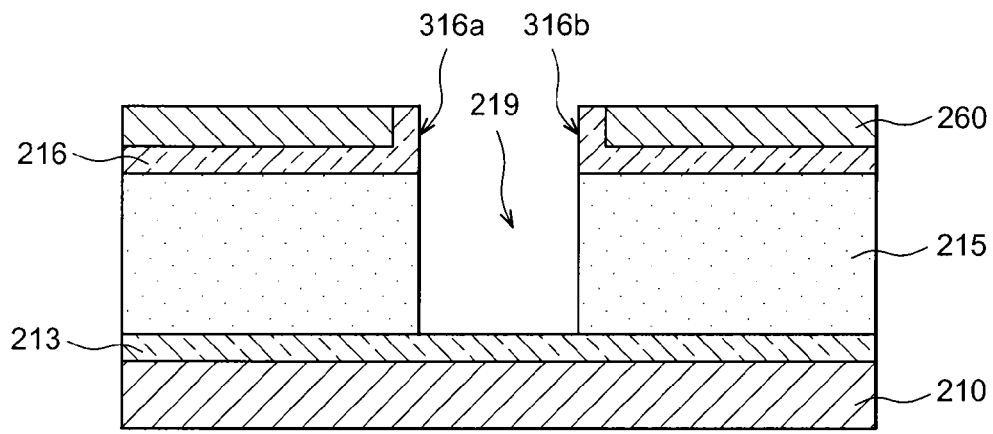
FIGS. 6A-6C illustrate a variant of the method according to the invention.
Figure 6B:
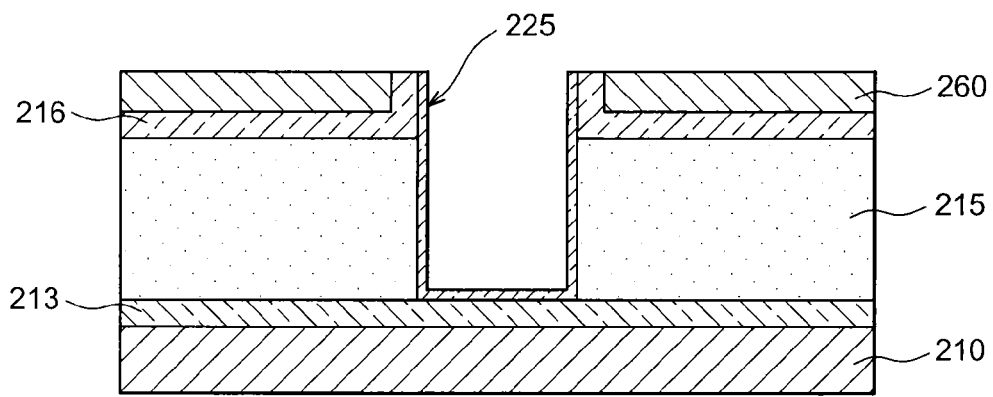
Figure 6C:
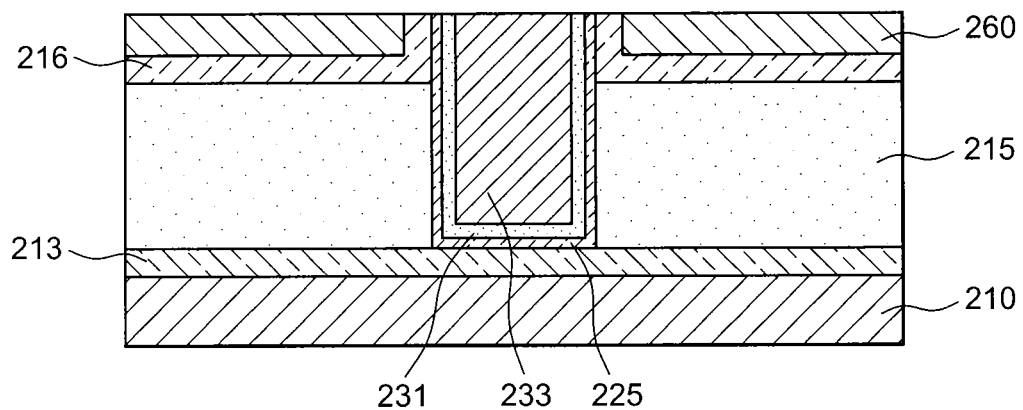

Another embodiment variant is illustrated in FIGS. 6A-6C.

For this variant, the metal line 260 of the upper level is this time encapsulated in the material of the second zone 216 which, in an advantageous manner, is a metal diffusion barrier material.

Said encapsulation may be carried out such that regions 316a, 316b of the second zone 216 cover the sides of the upper metal line 260 at the level of the cavity 219.

Said regions 316a, 316b are obtained during the formation of the metal line 260. The method implemented consists in carrying out a conformal deposition of a diffusion barrier followed by filling of the line and polishing. The material of the second zone 216 may be provided such that the latter serves both as diffusion barrier and intermediate layer of electrical contact between the semiconductor element 225 and the metal line 260. To perform as best as possible these two roles, the material of the second zone 216 may be a metal, such as titanium or tantalum, or a metal nitride such as titanium nitrate or tantalum nitride.

The cavity 219 formed in the dielectric layer 215 exposes the regions 316a, 316b (FIG. 6A).

The deposition is then carried out of the layer of semiconductor 225 in the cavity 219. The zones 316a, 316b can serve as barrier to a diffusion of metal (FIG. 6B).

Then are carried out steps of deposition of gate dielectric 231 then of gate material 233 in the cavity so as to form a gate electrode surrounded by the semiconductor layer 225 (FIG. 6C).

Figure 7A:
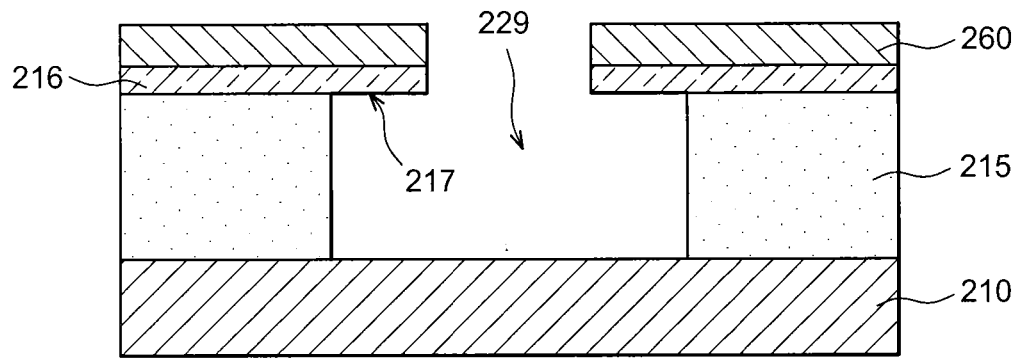
FIGS. 7A-7C illustrate another variant of the method according to the invention.
Figure 7B:
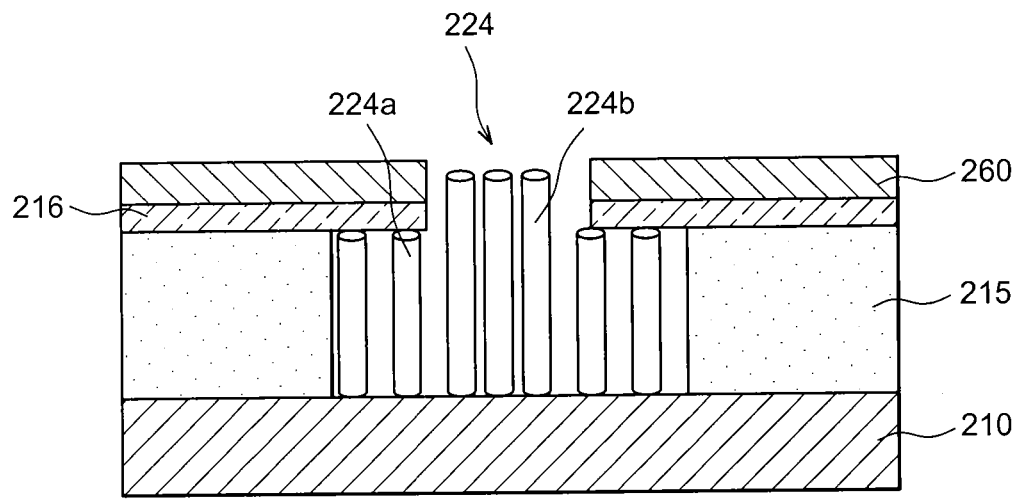
Figure 7C:
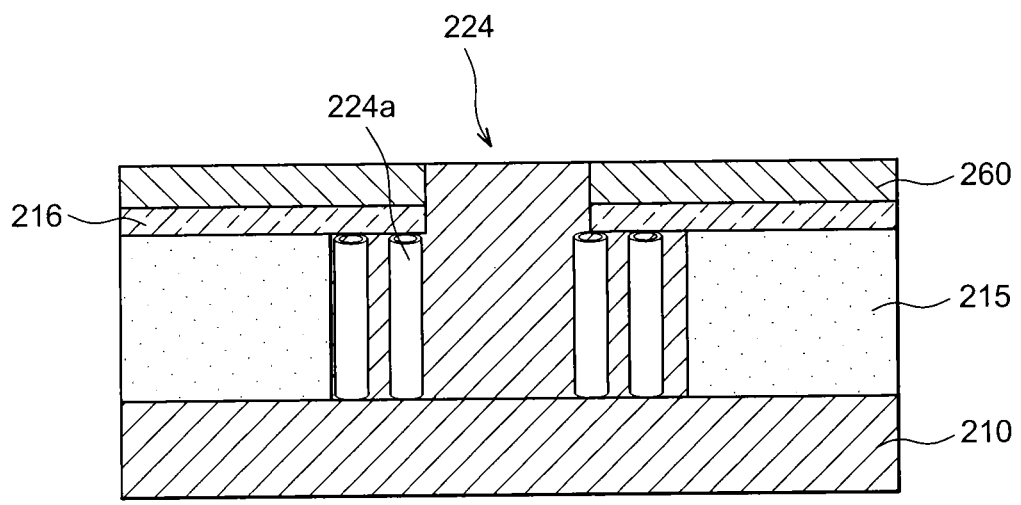

Another way of forming the interconnection element is growing several semiconductor nano-wires 224 as is illustrated in FIGS. 7A-7C.

In FIG. 7A, the device is shown in the course of being made. The metal line 210 is covered with a dielectric layer 215, for example based on SiO$_2$, itself covered with the second zone 216 which may be semi-conducting, for example based on Si.

The second zone 216 is itself covered with a second horizontal metal line 260 of a metal interconnection line above said given metal interconnection line.

In the dielectric layer 215, a cavity 229 has been made exposing a lower face 217 of said second zone 216 in contact with said second metal line 260 (FIG. 7A).

Said cavity 229 may have been formed by etching of said dielectric layer 215 so as to form an opening, then widening said opening.

Then, the semiconductor nano-wires 224 are formed by growth catalysed by the metal of the line 210 from the metal line 210. Said growth is carried out such that certain nanowires 224a reach a region of the lower face 217 or below said second zone 216 (FIG. 7B).

Then, a gate is formed by deposition of a gate dielectric and a gate material in the cavity 229, in the spaces left free between the nano-wires 224. Certain nano-wires 224b, which have been formed at the centre of the cavity 229 without coming into contact with the second zone 216, may have been removed beforehand by anisotropic etching, for example by means of a plasma using as mask the metal material of the second line 260 (FIG. 7C).

Figure 8A:
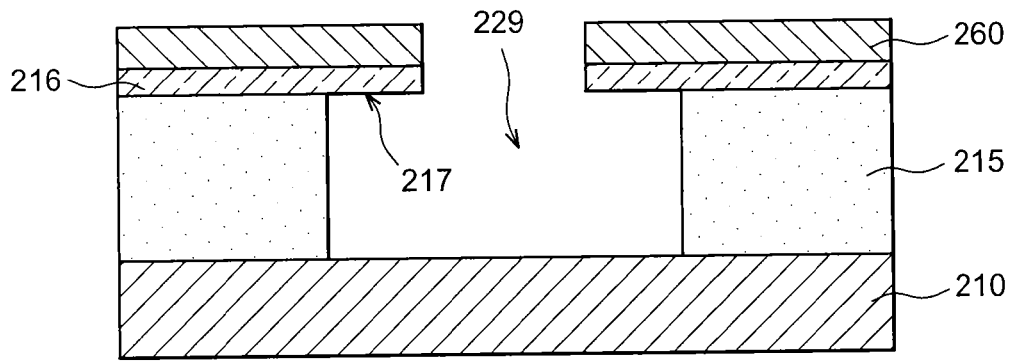
FIGS. 8A-8C illustrate another example of the method according to the invention.
Figure 8B:
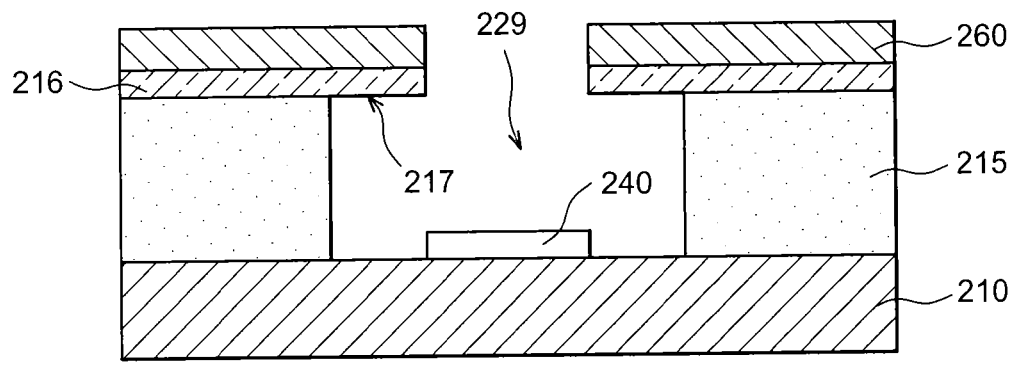
Figure 8C:
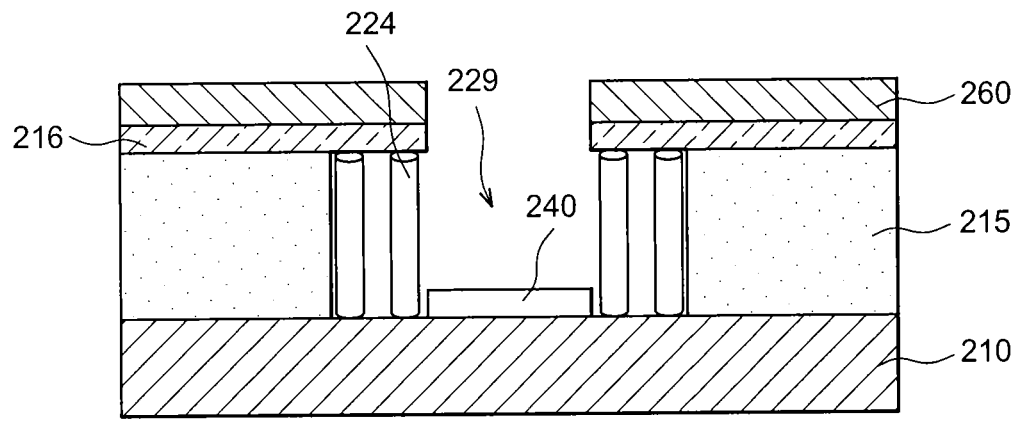

Another example of embodiment method is illustrated in FIGS. 8A-8C.

As represented in FIG. 8A, the initial cavity structure from which the method is carried out is similar to that represented in FIG. 7A.

As represented in FIG. 8B, a directional deposition is carried out, for example by evaporation, of a material 240 on the catalyst formed by the metal line 210, said material 240 forming a growth mask, thereby preventing the later growth of nano-wires 224 on the zones of the metal line 210 covered by the material 240. The material 240 is selected from materials not forming a catalyst during a growth of semiconductor nano-wires, and is for example based on nitride (silicon nitride, titanium nitrate, tantalum nitride) or non-metallic oxide (for example silicon oxide).

The growth is then carried out of semiconductor nano-wires (FIG. 8C), forming nano-wires 224 extending between the metal line 210 and the lower face 217 of the second zone 216. Following said growth, the material 240 may be conserved or not on the metal line 210. It is for example possible, when the material 240 is based on silicon oxide, to eliminate it through the implementation of a dry anisotropic etching using the upper metal layer 260 as etching mask.

Then, a gate electrode is formed in the cavity 229 particularly by means of steps of deposition of a layer of gate dielectric and gate material.

Another example of embodiment method is illustrated in FIGS. 9A-9D and 10. For this variant, the semiconductor element enabling the connection between metal lines is also formed of a series of nano-wires. However, said series of nano-wires is formed prior to a cavity in which is formed the gate structure making it possible to control the conduction of the semiconductor element.

Figure 9A:
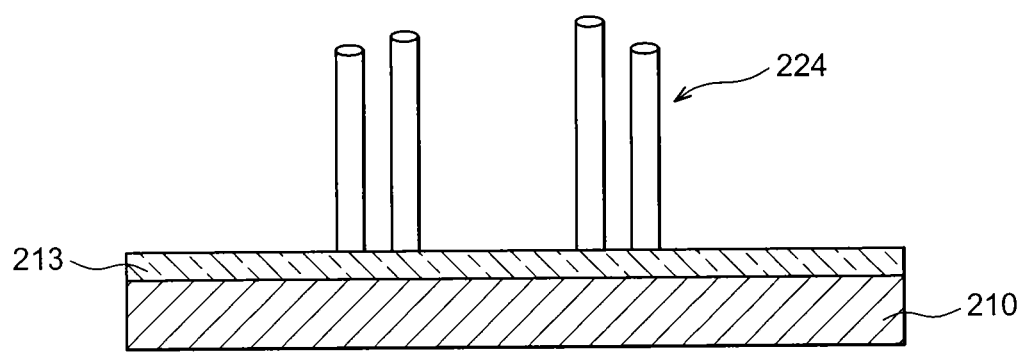
FIGS. 9A-9D and 10 illustrate another example of the method according to the invention.

In FIG. 9A, the device is shown in the course of being made.

The metal line 210 is covered with a first zone 213, which may be semiconductor.

Semiconductor nano-wires 224 are firstly made to grow from the semiconductor zone 213. Said growth may be carried out by means of a catalyst.

The nano-wires 224 are then covered with a dielectric layer 215, for example based on $SiO_2$.

Figure 9B:
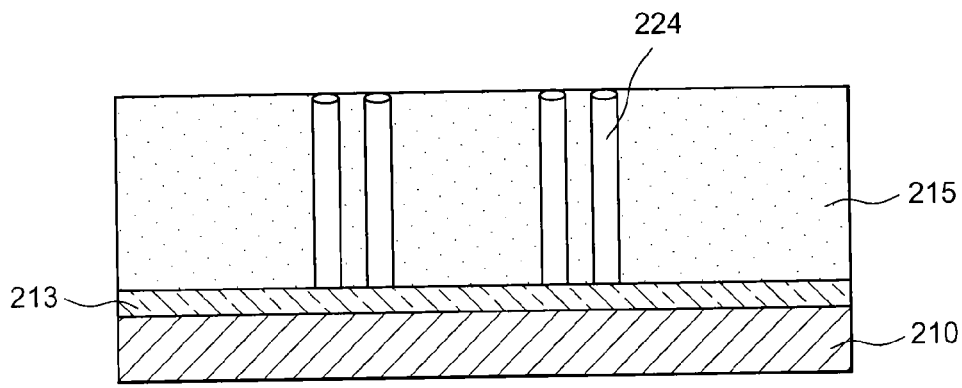
Figure 10:
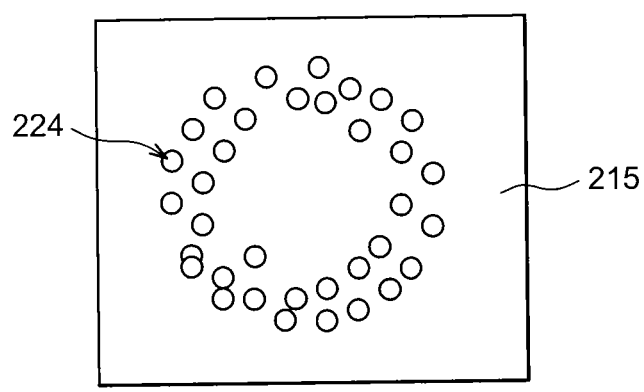

A step of polishing of the dielectric layer 215 is then carried out, so as to expose the free end of the nano-wires 224. Said step can make it possible to remove a portion of certain nano-wires 224 so as to obtain a series of nano-wires 224 of substantially equal respective heights (FIGS. 9B and 10, FIG. 10 representing the encapsulated nanowires in a top view).

Then are formed the second zone 216 and the second horizontal metal line 260 of a metal interconnection line above the metal level of the metal line 210. The second zone 216 may be semiconductor or metal and formed in contact with the free end of the nano-wires 224.

Figure 9C:
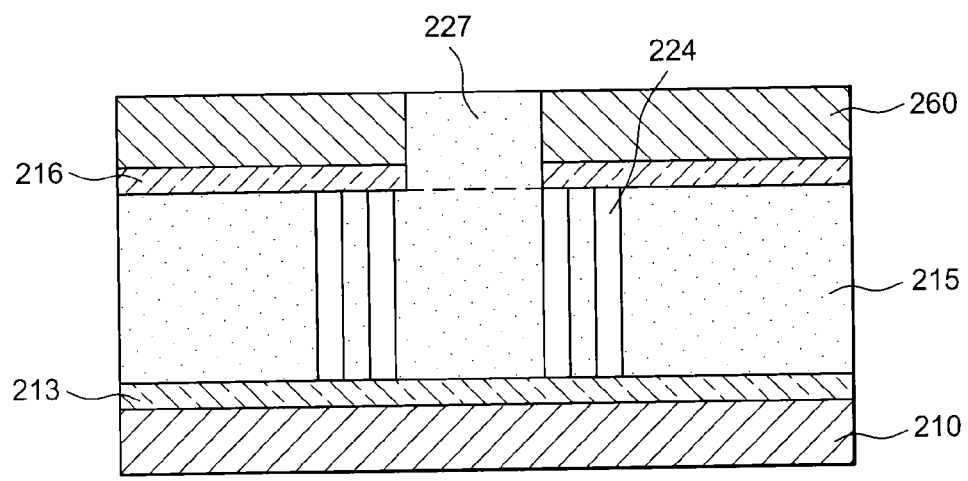

An opening through the metal line 260 and in the second zone 216 may be formed, then filled with dielectric material 227. A step of polishing of the dielectric material 227 may then be carried out, so as to remove the latter above the metal line 260 (FIG. 9C).

Figure 9D:
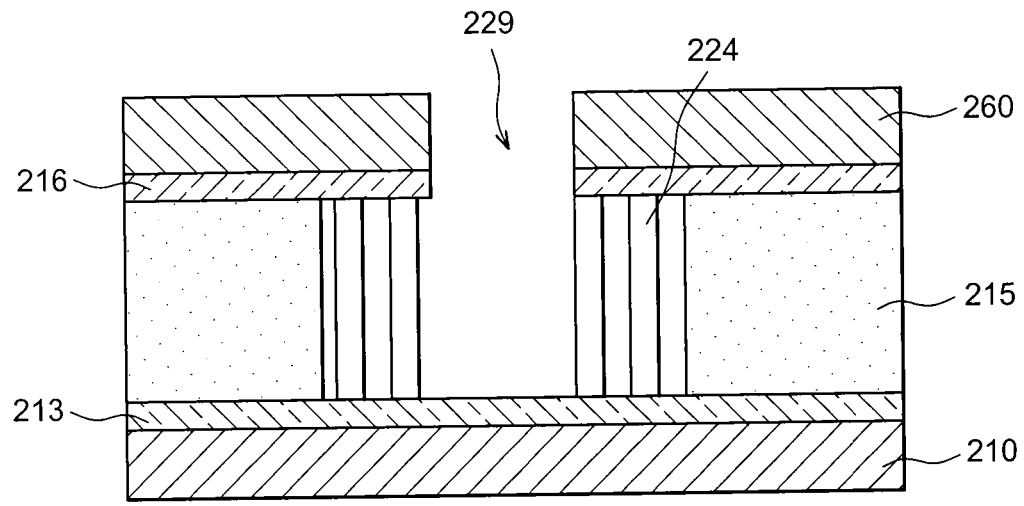

Then, a cavity 229 is formed by etching of the dielectric layer 215 and the dielectric material 227, so as to expose the nanowires 224 and the first zone 213 from which their growth has been carried out (FIG. 9D).

Then, a gate is formed by deposition of a gate dielectric and a gate material in the cavity 229.

In the case where the metal line 260 of the upper level is based on copper, a diffusion barrier may be provided.

In the examples described previously, the zones 213 and 216, which are optional, may be semiconductor and be optionally doped. The zones 213 and 216 may be formed based on Si deposited and optionally doped.

The zones 213, 216 present against the metal lines 210 and 260 may be provided in order to improve the electrical contact between the metal and the semiconductor.

Said zones 213 and 216 may be formed of a metal, such as for example aluminium, chromium or tantalum, having a small difference between the output work of said metal and the electron affinity of the semiconductor element 224.

The invention claimed is:

1. A method for producing a microelectronic device, comprising:
forming, on a first metal line of a first metal interconnection level, at least one semiconductor connection element arranged in a cavity formed through a dielectric layer resting on the first metal line, the at least one semiconductor connection element being configured to connect the first metal line to a second metal line of another metal interconnection line located above the first metal interconnection line, wherein the at least one semiconductor connection element extends in a length direction forming a nonzero angle with the first metal line and second metal line;
forming a dielectric layer around an outer surface of the at least one semiconductor element along the length direction; and
forming, in the cavity, a gate electrode configured to control conduction of the at least one semiconductor connection element,
wherein the gate electrode surrounds substantially all of an outer surface of the dielectric layer along the length direction of the at least one semiconductor element.

2. The method according to claim 1, wherein the forming the at least one semiconductor element includes growth directly on the first metal line.

3. The method according to claim 2, wherein the growth of the at least one semiconductor element is carried out by a catalyst deposited on the first metal line.

4. The method according to claim 3, wherein the cavity comprises lateral sides and a bottom, the bottom exposing the first metal line, the growth of the at least one semiconductor element being carried out by a block of catalyst formed by selective deposition without covering the sides of the cavity.

5. The method according to claim 2, wherein the growth of the at least one semiconductor element is carried out by using metal material of the first metal line as a catalyst.

6. The method according to claim 1, wherein the forming the at least one semiconductor connection element comprises deposition of at least one semiconductor layer electrically connecting the first metal line to the second metal line.

7. The method according to claim 1, wherein the at least one semiconductor element is formed of a plurality of nano-wires.

8. The method according to claim 7, further comprising, prior to forming the gate electrode:
   growing the nano-wires;
   forming the dielectric layer so as to surround the nano-wires; and
   forming the cavity by etching the dielectric layer around the nano-wires and so as to expose the nano-wires.

9. The method according to claim 7, further comprising, prior to forming the gate electrode:
   forming the dielectric layer and the cavity in the dielectric layer;
   then growing the nano-wires in the cavity; and
   forming a gate in the cavity.

10. A microelectronic device, comprising:
    a substrate and a plurality of metal interconnection levels stacked on the substrate;
    a first metal line of a first metal interconnection level;
    a second metal line of another metal interconnection line located above the first metal interconnection line, the first and second lines being interconnected via at least one semiconductor connection element extending in a length direction forming a nonzero angle with the first metal line and a second metal line;
    a dielectric layer on an outer surface of the at least one semiconductor element along the length direction; and
    a gate electrode configured to control conduction of the at least one semiconductor connection element, at least one region of the gate electrode being surrounded by the semiconductor connection element,
    wherein the gate electrode surrounds substantially all of an outer surface of the dielectric layer along the length direction of the at least one semiconductor element.

11. The microelectronic device according to claim 10, wherein the at least one semiconductor element is formed of a semiconductor layer surrounding the gate electrode.

12. The microelectronic device according to claim 10, wherein the at least one semiconductor element is formed of a plurality of nano-wires.

* * * * *